US011150302B2

(12) United States Patent
    Huo et al.

(10) Patent No.: US 11,150,302 B2
(45) Date of Patent: Oct. 19, 2021

(54) HIGH VOLTAGE DETECTION CIRCUIT AND METHOD

(71) Applicant: Contemporary Amperex Technology Co., Limited, Ningde (CN)

(72) Inventors: Jirong Huo, Ningde (CN); Yanhui Fu, Ningde (CN); Le Chu, Ningde (CN); Qiandeng Li, Ningde (CN)

(73) Assignee: Contemporary Amperex Technology Co., Limited, Ningbo (CN)

( * ) Notice: Subject to any disclaimer, the term of this patent is extended or adjusted under 35 U.S.C. 154(b) by 171 days.

(21) Appl. No.: 16/658,081

(22) Filed: Oct. 19, 2019

(65) Prior Publication Data

US 2020/0271726 A1    Aug. 27, 2020

(30) Foreign Application Priority Data

Feb. 25, 2019    (CN) .......................... 201910138230.7

(51) Int. Cl.
    *G01R 31/00*    (2006.01)
    *G01R 31/36*    (2020.01)
(52) U.S. Cl.
    CPC ................ *G01R 31/3648* (2013.01)
(58) Field of Classification Search
    USPC ......... 324/426, 429, 434; 320/103, 118, 132
    See application file for complete search history.

(56) References Cited

U.S. PATENT DOCUMENTS

| 8,723,356 B2 | 5/2014 | Fukuyama et al. |
| 10,035,422 B2 | 7/2018 | Zhou et al. |
| 2010/0194354 A1* | 8/2010 | Gotou ................... B60L 8/003 320/163 |
| 2012/0062029 A1 | 3/2012 | Fukuyama et al. |
| 2017/0016946 A1* | 1/2017 | Reese ................... G01R 31/50 |
| 2020/0011929 A1* | 1/2020 | Wang ................... B60L 3/0046 |

FOREIGN PATENT DOCUMENTS

| CN | 105137336 A | 12/2015 |
| CN | 105548892 A | 5/2016 |
| CN | 105676117 A | 6/2016 |
| CN | 205941816 U | 2/2017 |
| CN | 106842005 A | 6/2017 |

(Continued)

OTHER PUBLICATIONS

The Extended European search report dated Jun. 23, 2020 for European application No. 19208875.5, 11 pages.

(Continued)

*Primary Examiner* — Vincent Q Nguyen
(74) *Attorney, Agent, or Firm* — Law Offices of Liaoteng Wang

(57) ABSTRACT

The present application provides a high voltage detection circuit and method. The high voltage detection circuit includes a current adjustment module configured to be turned on or off to adjust a current in a high voltage circuit, a first detection module configured to provide a detection signal and transmit the detection signal to a processor module and the processor module configured to determine whether a master positive switch or a master negative switch is in malfunction according to a desired operation state of the master positive switch, a desired operation state of the master negative switch and the detection signal.

6 Claims, 12 Drawing Sheets

(56) References Cited

FOREIGN PATENT DOCUMENTS

| | | |
|---|---|---|
| CN | 107576914 A | 1/2018 |
| CN | 107727923 A | 2/2018 |
| CN | 107797054 A | 3/2018 |
| CN | 107850643 A | 3/2018 |
| CN | 107942243 A | 4/2018 |
| CN | 108469584 A | 8/2018 |
| CN | 108627765 A | 10/2018 |
| CN | 108713150 A | 10/2018 |
| CN | 109143048 A | 1/2019 |
| EP | 2012338 A1 | 1/2009 |

OTHER PUBLICATIONS

The first Official Action and search report dated Dec. 19, 2019 for Chinese application No. 201910138230.7, 14 pages.

\* cited by examiner

HIGH VOLTAGE DETECTION CIRCUIT AND METHOD

CROSS-REFERENCE TO RELATED APPLICATION

The present application is based upon and claims priority to Chinese Patent Application No. 201910138230.7, filed on Feb. 25, 2019, which is incorporated herein by reference in its entirety

TECHNICAL FIELD

The application relates to the field of electric power technology, and in particular, a high voltage detection circuit and a high voltage detection method.

BACKGROUND

With rapid development of new energies, the new energies can provide power for more and more devices. For example, a battery module, a battery pack, etc. can be used as a power source to power new energy vehicles, new energy ships, new energy aircrafts or the like.

Safety of a high voltage circuit for such as a battery module and a battery pack which is providing power is one of important considerations for safety of a power battery system. Due to increased insulation resistance and capacitance in a new energy vehicle or the like, it takes a long time to achieve accurate failure detection of a high voltage circuit upon disconnection or connection of the high voltage circuit, which increases safety risk of the high voltage circuit.

SUMMARY

Embodiments of the present application provide a high voltage detection circuit and a high voltage detection method, which is able to improve failure detection speed for a high voltage circuit and reduce safety risk of the high voltage circuit.

In a first aspect, there is provided a high voltage detection circuit. The high voltage detection circuit includes: a current adjustment module configured to be turned on or off to adjust a current in a high voltage circuit, wherein a first port of the current adjustment module is connected to a terminal of a master positive switch in the high voltage circuit where the master positive switch is connected to a load, a second port of the current adjustment module is connected to a terminal of a master negative switch in the high voltage circuit where the master negative switch is connected to the load, and a third port of the current adjustment module is connected to a reference voltage terminal; a first detection module configured to provide a detection signal and transmit the detection signal to a processor module, wherein a first port of the first detection module is connected to a terminal of the master positive switch where the master positive switch is connected to a battery pack, a second port of the first detection module is connected to a terminal of the master negative switch where the master negative switch is connected to the battery pack, a third port of the first detection module is connected to the reference voltage terminal; and the processor module configured to determine whether a positive switch unit or a negative switch unit is in malfunction according to a desired operation state of the positive switch unit, a desired operation state of the negative switch unit and the detection signal, wherein the processor module is connected to the first detection module, and wherein the positive switch unit includes the master positive switch or includes the master positive switch and a master positive pre-charge switch, and the negative switch unit includes the master negative switch or includes the master negative switch and a master negative pre-charge switch.

In a second aspect, there is provided a detection method in a high voltage detection circuit. The detection method includes: controlling a current adjustment module to be turned on or off to adjust a current in the high voltage circuit; acquiring a desired operation state of a positive switch unit, a desired operation state of a negative switch unit and a detection signal, wherein the detection signal is acquired when the current adjustment module is turned on or off; and determining whether the positive switch unit or the negative switch unit is in malfunction according to the desired operation state of the positive switch unit, the desired operation state of the negative switch unit and the detection signal, wherein the positive switch unit includes the master positive switch or includes the master positive switch and a master positive pre-charge switch, and the negative switch unit includes the master negative switch or includes the master negative switch and a master negative pre-charge switch.

Embodiments of the present invention provide a high voltage detection circuit and a high voltage detection method. The high voltage detection circuit includes a current adjustment module, a first detection module, and a processor module. The processor module may acquire a detection signal from the first detection module, and determine whether a positive switch unit or a negative switch unit is in malfunction according to a desired operation state of the positive switch unit, a desired operation state of the negative switch unit and the detection signal. When the high voltage circuit is powered on or off, current in the high voltage circuit can be adjusted due to turning on and turning off of the current adjustment module, and speed of discharging and charging vehicle capacitors in the high voltage circuit can be accelerated. Therefore, failure detection of the high voltage circuit can be performed as soon as possible, and thus speed of failure detection of the high voltage circuit can be improved, thereby reducing safety risk of the high voltage circuit.

BRIEF DESCRIPTION OF THE DRAWINGS

The present application may be better understood from the following description of embodiments of the present application. In the accompanying drawings, the same or like reference signs denotes the same or like features.

DETAILED DESCRIPTION

Figure 1:
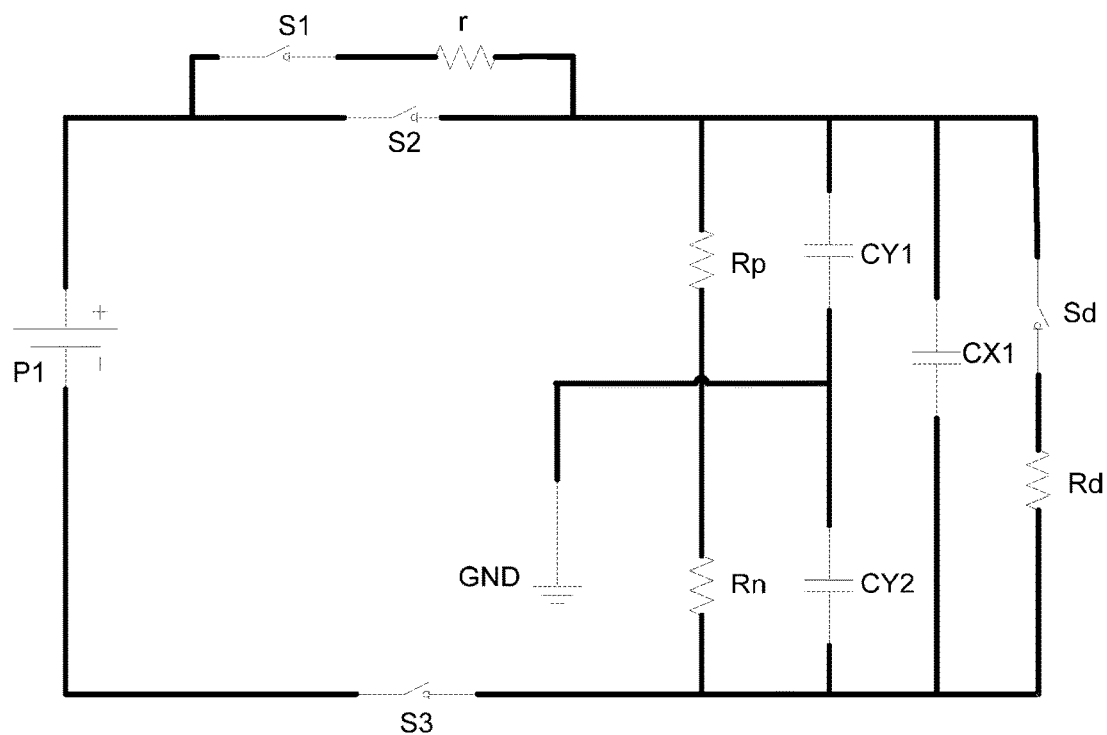
FIG. 1 is a schematic structural diagram of a high voltage circuit according to an embodiment of the present application.

Features and exemplary embodiments of various aspects of the present application are described in detail below. In the following detailed description, numerous specific details are set forth in order to provide better understanding of the present application. However, it will be apparent to those skilled in the art that the present application may be practiced without some of the details. The following description of the embodiments is merely provided to provide a better understanding of the present application. The present application is in no way limited to any specific configurations and algorithms set forth below, but covers various modifications, replacements and alternations of the elements, components and algorithms without departing from the spirit and scope of the present application. In the drawings and the following description, well-known structures and techniques are not shown in order to avoid unnecessary obscuring of the present application.

The embodiment of the present application provides a high voltage detection circuit and detection method therefor, which is applicable to a device using a battery pack as a power source, which is not limited herein. The high voltage detection circuit in embodiments of the present application accesses a high voltage circuit in a device using a battery pack as a power source during operation, thereby enabling detection of the high voltage circuit. Specifically, it is able to detect a master positive switch and a master negative switch in the high voltage circuit so as to detect whether the master positive switch or the master negative switch in the high voltage circuit is in malfunction. If the high voltage circuit includes a pre-charge branch, it is also possible to detect when a pre-charge switch in the pre-charge branch is in malfunction. The malfunction of the switch mentioned above may be an unanticipated failure, that is, the actual operation state of the switch is opposite to a desired operation state of the switch, such as an adhesion failure.

For convenience of explanation, a high voltage circuit is first introduced by taking the high voltage circuit and a high voltage detection circuit being installed in a new energy vehicle as an example. FIG. 1 is a schematic structural view of a high voltage circuit according to an embodiment of the present application. As shown in FIG. 1, the high voltage circuit includes a battery pack, a master positive switch S2, a master negative switch S3, a master positive pre-charge switch S1, a master positive pre-charge resistor r, an insulation impedance Rp from the master positive switch S2 to a reference voltage terminal at a lower voltage side, an insulation impedance Rn from the master negative switch S3 to the reference voltage terminal at the lower voltage side, a vehicle capacitor CY1 from the master positive switch S2 to the reference voltage terminal at the lower voltage side (generally called as Y capacitor, hereinafter referred to as vehicle capacitor Y from the master positive switch S2 to the reference voltage terminal at the lower voltage side), a vehicle capacitor CY2 from the master negative switch S3 to the reference voltage terminal at the lower voltage side (generally called as Y capacitor, hereinafter referred to as vehicle capacitor Y from the master positive switch S2 to the reference voltage terminal at the lower voltage side), a vehicle capacitor CX1 (generally called as X capacitor, hereinafter referred to as vehicle capacitor X between the master positive switch S2 and the master negative switch S3), a load Rd, and a switch Sd for controlling the load. It should be noted that the high voltage circuit may further include a master negative pre-charge switch and a master negative pre-charge resistor, which are not limited herein.

The master negative pre-charge switch is connected in series with the master negative pre-charge resistor, and the series connection of master negative pre-charge switch and the master negative pre-charge resistor is connected in parallel with the master negative switch S3.

The master positive pre-charge switch S1 is connected in series with the master positive pre-charge resistor r, and the series connection of the master positive pre-charge switch S1 and the master positive pre-charge resistor r is connected in parallel with the master positive switch S2. One terminal of the master positive switch S2 is connected to a positive electrode of the battery pack. One terminal of the master negative switch S3 is connected to the negative of the battery pack. The insulation resistance Rp from the master positive switch S2 to the reference voltage terminal at a lower voltage side is connected in parallel with the vehicle Y capacitor CY1 from the master positive switch S2 to the reference positive voltage terminal. The insulation resistance Rn from the master negative switch S3 to the reference voltage terminal at the lower voltage side is connected in parallel with the vehicle Y capacitor CY2 from master negative switch S3 to the reference voltage terminal at the lower voltage side.

The battery pack may specifically be a high voltage battery pack. The master positive switch S2, the master negative switch S3 and the master positive pre-charge switch S1 may specifically be relays. If the high voltage circuit includes a master negative pre-charge switch, the master negative pre-charge switch may specifically be a relay. The reference voltage terminal may specifically be a vehicle ground, and thus a connection to the reference voltage terminal may be a connection to the vehicle ground.

Figure 2:
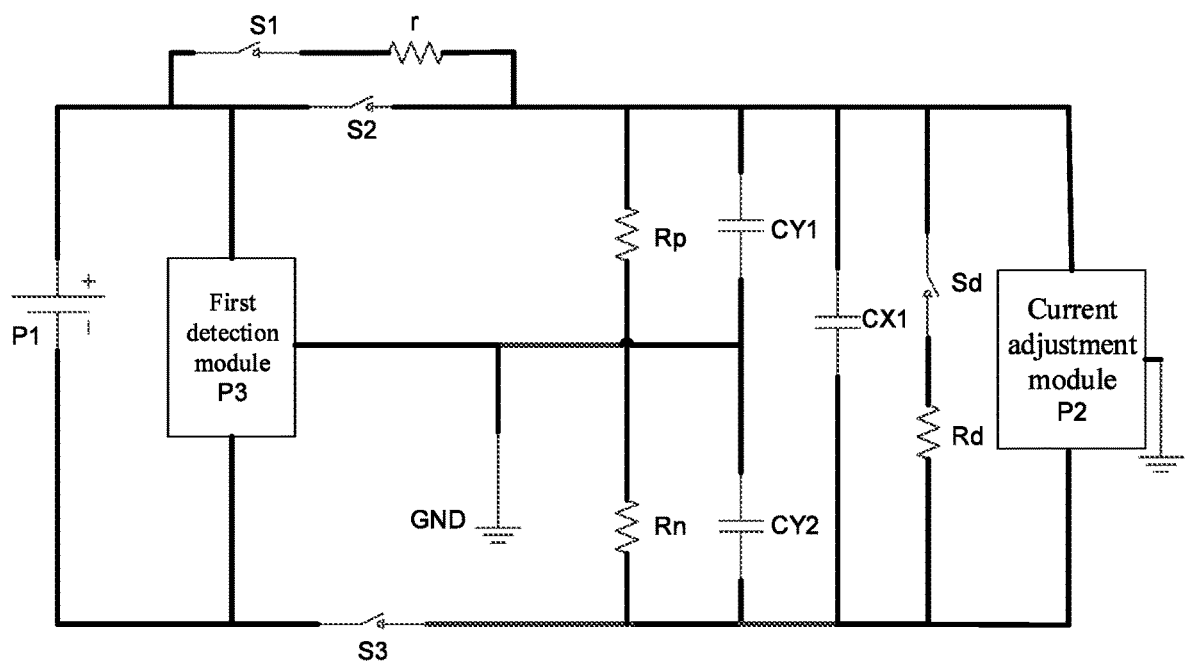
FIG. 2 is a schematic structural diagram of a high voltage detection circuit according to an embodiment of the present invention.

FIG. 2 is a schematic structural diagram of a high voltage detection circuit according to an embodiment of the present application (a processor module is not shown). As shown in FIG. 2, the high voltage detection circuit includes a current adjustment module P2, a first detection module P3, and a processor module.

A first port of the current adjustment module P2 is connected to a terminal of the master positive switch S2 in the high voltage circuit where the master positive switch S2 is connected to the load, and a second port of the current adjustment module P2 is connected to a terminal of the master negative switch S3 in the high voltage circuit where the master negative switch S3 is connected to the load, and a third port of the current adjustment module P2 is connected to the reference voltage terminal.

The first port, the second port and the third port of the current adjustment module P2 are detachable. The current adjustment module P2 is configured to be turned on or off to adjust a current in a high voltage circuit. Specifically, in the case where the current adjustment module P2 is turned on, the current in the high voltage circuit is increased. The current adjustment module P2 includes resistor sets, but the number of resistor sets is not limited herein.

A first port of the first detection module P3 is connected to a terminal of the master positive switch S2 where the master positive switch S2 is connected to the battery pack P1, and a second port of the first detection module P3 is connected to a terminal of the master negative switch S3 where master negative switch S3 is connected to the battery pack P1, and a third port of the first detection module P3 is connected to the reference voltage terminal. The first detection module P3 is configured to provide a detection signal and transmits the detection signal to the processor module.

The first port, the second port and the third port of the first detection module P3 are detachable. The detection signal provided by the first detection module P3 is detected by the processor module, that is, the processor module can acquire the detection signal from the first detection module P3.

The detection signal may be a voltage signal, a current signal, or the like, and is not limited herein. For convenience of explanation, in the following embodiments, the description is provided by taking the detection signal being as a voltage signal as an example.

The processor module is connected to the first detection module P3. The processor module is configured to determine whether a positive switch unit or a negative switch unit is in malfunction according to a desired operation state of the positive switch unit, a desired operation state of the negative switch unit and the detection signal.

It should be noted that the positive switch unit may include the master positive switch or include the master positive switch and a master positive pre-charge switch. The negative switch unit may include a master negative switch or includes a master negative switch and a master negative pre-charge switch. In embodiments of the present application, for convenience of explanation, the description is provided by taking the positive switch unit including the master positive switch and a master positive pre-charge switch and the negative switch unit includes the master negative switch as an example.

The desired operation state is an operation state that is expected. For example, the desired operation state of the master positive switch S2 is an operation state in which the master positive switch S2 is expected to be in operation. For example, when the high voltage circuit is powered off, the master positive switch S2 needs to be turned off, and in this case, the desired operation state of the master positive switch S2 is the off state. If an actual operation state of the master positive switch S2 does not match the desired operation state, it may be determined that the master positive switch S2 is in malfunction. Similarly, whether the master negative switch S3, the master positive pre-charge switch S1 or the master negative pre-charge switch is in malfunction may be determined in a similar way as the master positive switch S2.

It should be noted that detection of the high voltage detection circuit is generally performed before power-on or during power-off of the high voltage circuit. Before power-on or during power-off, it is default that the desired operation state of the master positive pre-charge switch S1 is the off state and the desired operation state of the master negative pre-charge switch is the off state.

In embodiments of the present application, the high voltage detection circuit includes a current adjustment module P2, a first detection module P3 and a processor module. The processor module may acquire a detection signal from the first detection module, and determine whether a positive switch unit or a negative switch unit is in malfunction according to a desired operation state of the positive switch unit, a desired operation state of the negative switch unit and the detection signal. When the high voltage circuit is powered on or off, current in the high voltage circuit can be adjusted due to turning on and turning off of the current adjustment module, and speed of discharging and charging vehicle capacitors in the high voltage circuit can be accelerated. Therefore, failure detection of the high voltage circuit can be performed as soon as possible, and thus speed of failure detection of the high voltage circuit can be improved, thereby reducing safety risk of the high voltage circuit.

Figure 3:
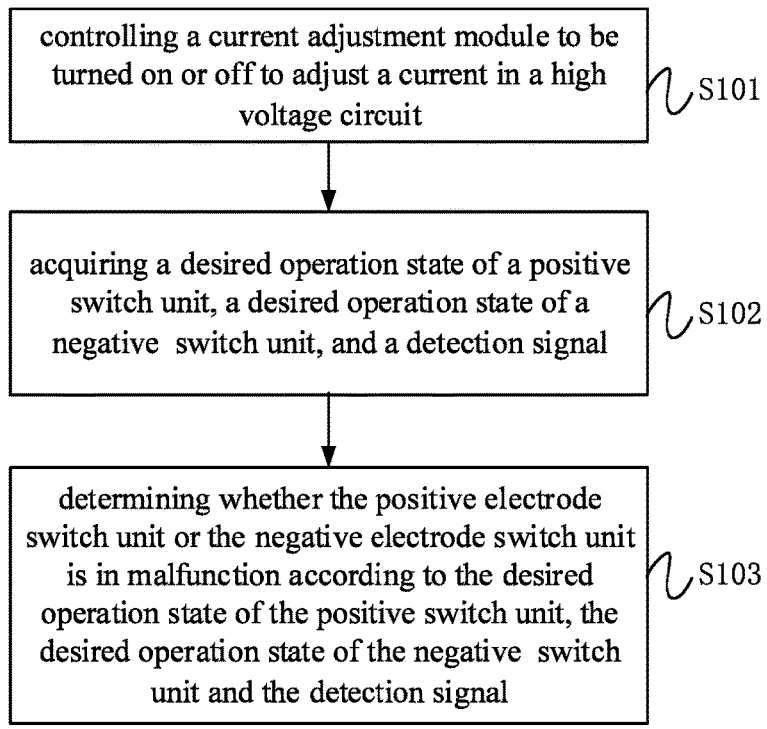
FIG. 3 is a flowchart of a detection method in a high voltage detection circuit according to an embodiment of the present application.

The embodiments of the present application further provides a detection method in a high voltage detection circuit, which is applicable to the high voltage detection circuit in the embodiment shown in FIG. 2 above. FIG. 3 is a flowchart of a detection method in a high voltage detection circuit according to an embodiment of the present application. As shown in FIG. 3, the detection method in the high voltage detection circuit includes steps S101 to S103.

In step S101, a current adjustment module is controlled to be turned on or off to adjust a current in the high voltage circuit.

In step S102, a desired operation state of a positive switch unit, a desired operation state of a negative switch unit and a detection signal are acquired.

The detection signal is acquired when the current adjustment module is turned on or off. The turning on or turning off of the current adjustment module changes an impedance value of the high voltage circuit. Therefore, if the current in the high voltage circuit changes, the detection signal will change or not change accordingly. Different desired operation states of the positive switch unit and the negative switch unit correspond to different detection signals.

In step S103, it is determined whether the positive switch unit or the negative switch unit is in malfunction according to the desired operation state of the positive switch unit, the desired operation state of the negative switch unit and the detection signal.

The positive switch unit may include the master positive switch or include the master positive switch and a master positive pre-charge switch. The negative switch unit may include the master negative switch or include the master negative switch and a master negative pre-charge switch. If the detection signal does not coincide with a detection signal corresponding to a desired operation state of the positive switch unit or the detection signal does not coincide with a detection signal corresponding to a desired operation state of the negative switch unit, it may be determined that the positive switch unit or the negative switch unit is in malfunction.

In embodiments of the present application, the high voltage detection circuit includes a current adjustment module, a first detection module, and a processor module. The processor module may acquire a detection signal from the first detection module, and determine whether a positive switch unit or a negative switch unit is in malfunction according to a desired operation state of the positive switch unit, a desired operation state of the negative switch unit and the detection signal. When the high voltage circuit is powered on or off, current in the high voltage circuit can be adjusted due to turning on and turning off of the current adjustment module, and speed of discharging and charging vehicle capacitors in the high voltage circuit can be accelerated. Therefore, failure detection of the high voltage circuit can be performed as soon as possible, and thus speed of failure detection of the high voltage circuit can be improved, thereby reducing safety risk of the high voltage circuit.

Figure 4:
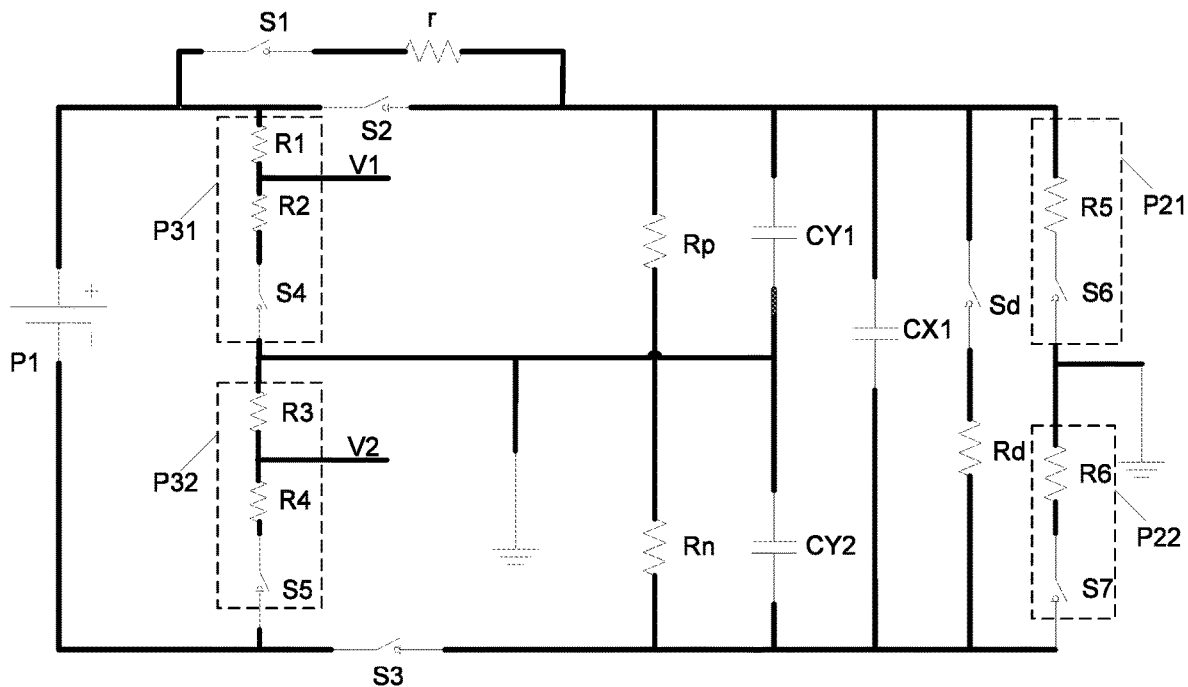
FIG. 4 is a schematic structural diagram of a specific implementation of a high voltage detection circuit according to an embodiment of the present application.

FIG. 4 is a schematic structural diagram of a specific implementation of a high voltage detection circuit according to an embodiment of the present application (the processor module is not shown). As shown in FIG. 4, the first detection module P3 in the above embodiments may include a first detection unit P31 and a second detection unit P32. The current adjustment module P2 may include a first adjustment unit P21 and a second adjustment unit P22.

One terminal of the first detection unit P31 is the first port of the first detection module P3, and the other terminal of the first detection unit P31 is the third port of the first detection module P3. The first detection unit P31 includes resistor sets, or includes a series connection of resistor sets and a switch device. If the first detection unit P31 includes a switch device, which controls turning on and off of the first detection unit P31. The number of resistor sets in the first detection unit P31 and the number of switch devices are not limited herein. The positional relationship between the switch device and the resistor set is also not limited. For example, as shown in FIG. 4, the first detection unit P31 includes a resistor set R1 and a resistor set R2 and a switch device S4. The resistor set R1, the resistor set R2 and the switch device S4 are connected in series, and the switch device S4 is connected to the third port of the first detection module P3. In other examples, the switch device S4 may also be disposed between the resistor set R1 and the resistor set R2. Alternatively, the switch device S4 may also be connected to the first port of the first detection module P3. If the switch device S4 is turned on, the positive electrode of the battery pack, the first detection unit P31, and the reference voltage terminal form a communication path.

In some embodiments, the detection signal acquired by the processor module from the first detection unit P31 is a voltage signal between at least one resistor set of the first detection unit P31 and the reference voltage terminal. For example, as shown in FIG. 4, a collection point for acquiring the detection signal by the processor module from the first detection unit P31 may be set between the resistor set R1 and the resistor set R2. If the switch device S4 is turned on, the detection signal acquired by the processor module from the first detection unit P31 is a voltage signal V1 between the resistor set R2 and the reference voltage terminal. In some examples, the detection signal acquired by the processor module from the first detection unit P31 may also be a voltage signal between at least one resistor set of the first detection unit P31 and the negative electrode of the battery pack P1.

One terminal of the second detection unit P32 is the third port of the first detection module P3, and the other terminal of the second detection unit P32 is the second port of the first detection module P3. The second detection unit P32 includes resistor sets, or a series connection of resistor sets and a switch devices. The second detection unit includes the switch device, which controls turning on and turning off of the second detection unit P32. The number of resistor sets in the second detection unit P32 and the number of switch devices are not limited herein. The positional relationship between the switch device and the resistor sets is also not limited. For example, as shown in FIG. 4, the second detection unit P32 includes a resistor set R3 and a resistor set R4, and a switch device S5. The resistor set R3, the resistor set R4 and the switch device S5 are connected in series, and the switch device S5 is connected to the second port of the first detection module P3. In other examples, the switch device S5 may also be placed between the resistor set R3 and the resistor set R4. Alternatively, the switch device S5 may also be connected to the third port of the first detection module P3. If the switch device S5 is turned on, the reference voltage terminal, the second detection unit, and the negative electrode of the battery pack P1 form a communication path.

In some embodiments, the detection signal acquired by the processor module from the second detection unit P32 is a voltage signal between the at least one resistor set in the second detection unit P32 and the reference voltage terminal. For example, as shown in FIG. 4, a point for acquiring the detection signal by the processor module from the second detection unit P32 may be disposed between the resistor set R3 and the resistor set R4. If the switch device S5 is turned on, the detection signal acquired by the processor module is from the second detection unit P32 is a voltage signal V2 between the resistor set R4 and the reference voltage terminal. In some examples, the detection signal acquired by the processor module from the second detection unit P32 may also be a voltage signal between at least one resistor set of the second detection unit P32 and the negative electrode of the battery pack P1.

In some examples, the resistor sets in the first detection unit P31 are provided corresponding to respective resistor sets in the second detection unit P32 and have the same resistance value as respective resistor set in the second detection unit P32. For example, as shown in FIG. 4, the resistor set R1 is set corresponding to the resistor set R3, and resistance value $R_1$ of the resistor set R1 is the same as resistance $R_3$ of the resistor set R3, that is, $R_1=R_3$. The resistor set R2 is provided corresponding to the resistor set R4, and resistance value $R_2$ of the resistor set R2 is the same as resistance value $R_4$ of the resistor set R4, that is, $R_2=R_4$.

In other examples, due to difference between different ports of the first detection module P3 (i.e., the ports through which the processor module may acquire a detection signal from the first detection module P3), voltages at a location where respective detection ports are connected may also have difference. A total resistance value of all of the resistor sets in the first detection unit P31 may be greater than a total resistance value of all of the resistor sets in the second detection unit P32. For example, as shown in FIG. 4, the total resistance value in the first detection unit P31 is $R_1+R_2$, and the total resistance value in the second detection unit P32 is $R_3+R_4$, were $R_1+R_2>R_3+R_4$. In other embodiments, the resistance values of the resistor sets in the first detection unit P31 and the second detection unit P32 may also be set according to a detection range and a detection accuracy of each of the detection ports.

One terminal of the first adjustment unit P21 is the first port of the current adjustment module P2, and the other terminal of the first adjustment unit P21 is the third port of the current adjustment module P2. The first adjustment unit P21 includes resistor sets, or a series connection of resistor sets and a switch device. The number of resistor sets and the number of switch devices in the first adjustment unit P21 are not limited herein. The positional relationship between the switch device and the resistor set is also not limited. For example, as shown in FIG. 4, the first adjustment unit P21 includes a resistor set R5 and a switch device S6. The resistor set R5 is connected in series with the switch device S6, wherein the switch device S6 is connected to the third port of the current adjustment module P2. In other examples, the switch device S6 may also be coupled to the first port of current adjustment module P2. When the switch device S6 is turned on, the first adjustment unit P21 is turned on, and thus the vehicle capacitors CY1, CY2, and CX1 can be quickly discharged.

One terminal of the second adjustment unit P22 is the third port of the current adjustment module P2, and the other terminal of the second adjustment unit P22 is the second port of the current adjustment module P2. The second adjustment unit P22 includes resistor sets, or a series connection of resistor sets and a switch device. The number of resistor sets and the number of switch devices in the second adjustment unit P22 are not limited herein. The positional relationship between the switch device and the resistor set is also not limited. For example, as shown in FIG. 4, the second adjustment unit P22 includes a resistor set R6 and a switch device S7. The resistor set R6 is connected in series with the switch device S7, wherein the switch device S7 is connected to the second port of the current adjustment module P2. In other examples, the switch device S7 may also be coupled to the third port of the current adjustment module P2. When the switch device S7 is turned on, the second adjustment unit P22 is turned on, and thus the vehicle capacitors CY1, CY2, and CX1 can be quickly discharged.

In some examples, a total resistance value of all of the resistor sets in the first adjustment unit P21 is equal to a total resistance value of all of the resistor sets in the second adjustment unit P22. The total resistance value of all of the resistor sets in the first adjustment unit P21 is smaller than a total resistance value of all of the resistor sets in the first detection unit P31, wherein the total resistance value of all of the resistor sets in the first detection unit P31 is equal to a total resistance value of all of the resistor sets in the second detection unit P32. For example, as shown in FIG. 4, the resistance value $R_5$ of the resistor set R5 in the first adjustment unit P21 is equal to the resistance value $R_6$ of the resistor set R6 in the second adjustment unit P22. If the detection signal acquired from the second detection unit is a detection signal with respect to the negative electrode of the battery pack P1, the resistance value $R_1$ of the resistor set R1 in the first detection unit P31 and the resistance value $R_3$ of the resistor set R3 in the second detection unit P32 are equal, and the resistance value $R_2$ of the resistor set R2 in the first detection unit P31 and the resistance value $R_4$ of the resistor set R4 in the second detection unit P32 are equal. The resistance value $R_5$ of the resistor set R5 in the first adjustment unit P21 is smaller than the total resistance value $R_1+R_2$ of the resistor set R1 and the resistor set R2 in the first detection unit P31. That is, $R_5=R_6<R_1+R_2$. In some examples, the resistance value $R_5$ of the resistor set R5 in the first adjustment unit P21 is much smaller than the total resistance value $R_1+R_2$ of the resistor set R1 and the resistor set R2 in the first detection unit P31, which can further improve detection accuracy.

If the detection signal acquired from the second detection unit is a detection signal with respect to the reference voltage terminal, the resistance value $R_2$ of the resistor set R2 in the first detection unit P31 and the resistance value $R_3$ of the resistor set R3 in the second detection unit P32 are equal with each other.

In other examples, due to differences in the various ports of the current adjustment module P2, the voltages where the various ports are connected may also have difference. The total resistance value of all of the resistor sets in the first adjustment unit P21 is equal to the total resistance value of all of the resistor sets in the first detection unit P31. The total resistance value of all of the resistor sets in the second adjustment unit P22 is equal to the total resistance value of all of the resistor sets in the second detection unit P32. The total resistance value of all of the resistor sets in the first detection unit P31 is greater than the total resistance value of all of the resistor sets in the second detection unit P32. For example, as shown in FIG. 4, $R_5>R_6$, $R_5=R_1+R_2$, $R_1+R_2>R_3+R_4$.

Next, a detection method in a high voltage detection circuit will be described by taking the high voltage detection circuit shown in FIG. 4 as an example. The step S103 in the above embodiment may be specifically implemented as step S1031 to step S1032, or step S1033 to step S1034, or step S1035 to step S1036, or step S1037 to step S1038, or step S1041 to step S1042, or step S1043 or step S1044.

In step S1031, if the detection signal acquired from the first detection unit is greater than the detection signal acquired from the second detection unit, it is determined that the positive switch unit is not in malfunction.

In step S1032, if the detection signal acquired from the first detection unit is equal to the detection signal acquired from the second detection unit, it is determined that the positive switch unit is in malfunction.

A total resistance value of all of the resistor sets in the first detection unit is equal to a total resistance value of all of the resistor sets in the second detection unit. The desired operation state of the positive switch unit is an off state, and the desired operation state of the negative switch unit is an off state. The current adjustment module is turned on, specifically, the first adjustment unit and the second adjustment unit are turned on. For example, in a power-off process of the high voltage circuit, the positive switch unit is firstly disconnected, the negative switch unit has not been disconnected, the whole vehicle enters a power-off mode, and the vehicle capacitors CY1, CY2, and CX1 are accelerated to be discharged through the current adjustment module. As shown in FIG. 4, if the actual operation state of the positive switch unit is also an off state, only the resistor set R1 and the resistor set R2 are connected between the positive electrode of the battery pack and the reference voltage terminal. The total resistance between the negative electrode and the reference voltage terminal is that a series connection of the resistor set R3 and the resistor set R4 is connected in parallel with the insulation resistance Rn, and then connected in parallel with the resistor set R6. Therefore, a resistance value of a total resistance between the reference voltage terminal and the negative electrode of the battery pack is smaller than a resistance value of total resistance between the positive electrode of the battery pack and the reference voltage terminal.

The detection signal acquired from the first detection unit is a voltage signal V1 between the resistor set R2 and the reference voltage terminal, and the detection signal acquired from the second detection unit is a voltage signal V2 between the resistor set R4 and the reference voltage terminal, i.e. V1>V2.

If the actual operation unit of the positive switch unit is in an on state, a resistance value of total resistance between the positive electrode of the battery pack and the reference voltage terminal and a resistance value of total resistance between the reference voltage terminal and the negative electrode of the battery pack are substantively equal, i.e. V1=V2.

Figure 5A:
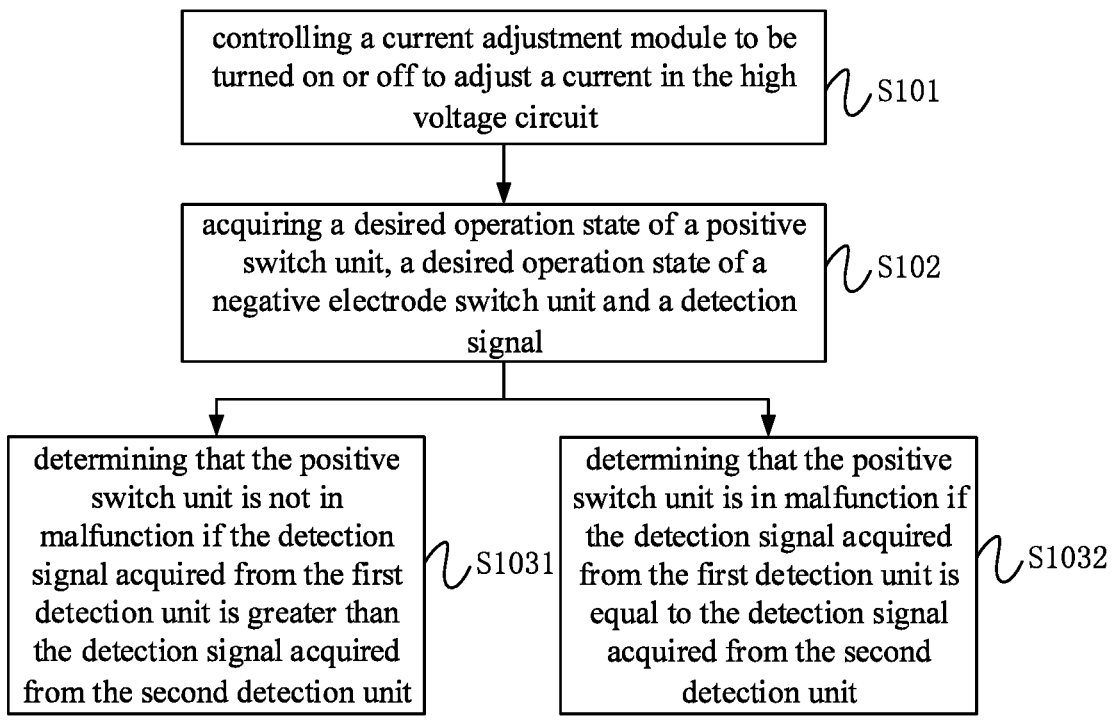
FIG. 5a is a flowchart of a specific implementation of a detection method in a high voltage detection circuit according to an embodiment of the present application.

For convenience of description, the step S103 in the above embodiment may be specifically implemented as the above steps S1031 to S1032 such that FIG. 5a is obtained. FIG. 5a is a flowchart of a specific implementation of a detection method in a high voltage detection circuit according to an embodiment of the present application. The difference between FIG. 5a and FIG. 3 is that step S103 in the above embodiment can be implemented as step S1031 to step S1032.

In step S1033, if the detection signal acquired from the first detection unit is smaller than the detection signal acquired from the second detection unit, it is determined that the positive switch unit is in malfunction.

In step S1034, if the detection signal acquired from the first detection unit is equal to the detection signal acquired from the second detection unit, it is determined that the positive switch unit has is not in malfunction.

A total resistance value of all of the resistor sets in the first detection unit is equal to a total resistance value of all of the resistor sets in the second detection unit. The desired operation state of the positive switch unit is an off state, the desired operation state of the negative switch unit is an off state, and the current adjustment module is turned on, specifically, the first adjustment unit and the second adjustment unit are turned on. For example, in a power-off process of the high voltage circuit, the negative switch unit is turned off first, and the positive switch unit is then turned off After the negative switch unit is turned off, the whole vehicle enters a power-off mode, and the vehicle capacitors CY1, CY2, and CX1 are accelerated to discharge through the current adjustment module. After the positive switch unit is turned off, the detection signal acquired from the first detection unit and the detection signal acquired from the second detection unit are compared.

If the actual operation unit of the positive switch unit is an off state, a resistance value of total resistance between the positive electrode of the battery pack and the reference voltage terminal is equal to a resistance value of total resistance between the reference voltage terminal and the negative electrode of the battery pack. Then, the detection signal V1 acquired from the first detection unit is equal to the detection signal V2 acquired by the second detection unit, that is, V1=V2.

If the actual operation state of the positive switch unit is an on state, a resistance value of total resistance between the positive electrode of the battery pack and the reference voltage terminal is smaller than a resistance value of total reference voltage between the reference voltage terminal and the negative terminal of the battery pack. Then, the detection signal V1 acquired from the first detection unit is smaller than the detection signal V2 acquired by the second detection unit, that is, V1<V2.

In step S1035, if the detection signal acquired from the first detection unit is equal to the detection signal acquired from the second detection unit, it is determined that the negative switch unit is in malfunction.

In step S1036, if the detection signal acquired from the first detection unit is smaller than the detection signal acquired from the second detection unit, it is determined that the negative switch unit is not in malfunction.

A total resistance value of all of the resistor sets in the first detection unit is equal to a total resistance value of all of the resistor sets in the second detection unit. The desired operation state of the positive switch unit is an on state, and the desired operation state of the negative switch unit is an off state. The current adjustment module is turned on, specifically, the first adjustment unit and the second adjustment unit are turned on. For example, in a power-off process of the high voltage circuit, the negative switch unit is first disconnected, the whole vehicle enters a power-off mode, and the vehicle capacitors CY1, CY2, and CX1 are accelerated to be discharged through the current adjustment module. As shown in FIG. 4, if the actual operation unit of the negative switch unit is also the off state, a resistance value of total resistance between the positive electrode of the battery pack and the reference voltage terminal is smaller than a resistance value of total resistance between the reference voltage terminal and the negative electrode of the battery pack, that is, V1<V2.

If the actual operation state of the negative switch unit is in an on state, a resistance value of total resistance between the positive electrode of the battery pack and the reference voltage terminal is smaller than a resistance value of total resistance between the reference voltage terminal and the negative electrode of the battery pack, that is, V1=V2.

In step S1037, if the detection signal acquired from the first detection unit is greater than the detection signal acquired from the second detection unit, it is determined that the negative switch unit is in malfunction.

In step S1038, if the detection signal acquired from the first detection unit is equal to the detection signal acquired from the second detection unit, it is determined that the negative switch unit is not in malfunction.

A total resistance value of all of the resistor sets in the first detection unit is equal to a total resistance value of all of the resistor sets in the second detection unit. The desired operation state of the positive switch unit is an off state, and the desired operation state of the negative switch unit is an off state. The current adjustment module is turned on, specifically, the first adjustment unit and the second adjustment unit are turned on. For example, in a power-off process of the high voltage circuit, the positive switch unit is turned off first, and the negative switch unit is then turned off. After the positive switch unit is disconnected, the whole vehicle enters a power-off mode, and the vehicle capacitors CY1, CY2, and CX1 are accelerated to discharge through the current adjustment module. After the negative switch unit is turned off, the detection signal acquired from the first detection unit and the detection signal acquired from the second detection unit are compared.

If the actual operation unit of the negative switch unit is an off state, a resistance value of total resistance between the positive electrode of the battery pack and the reference voltage terminal is equal to a resistance value of total resistance between the reference voltage terminal and the negative electrode of the battery pack. Then, the detection signal V1 acquired from the first detection unit is equal to the detection signal V2 acquired by the second detection unit, that is, V1=V2.

If the actual operation unit of the negative switch unit is in an on state, a resistance value of total resistance between the positive electrode of the battery pack and the reference voltage terminal is greater than a resistance value of total resistance between the reference voltage terminal and the negative electrode of the battery pack. Then, the detection signal V1 acquired from the first detection unit is greater than the detection signal V2 acquired by the second detection unit, that is, V1>V2.

In step S1041, if the detection signal acquired from the first detection unit remains unchanged, it is determined that the positive switch unit is in malfunction.

In step S1042, if the detection signal acquired from the first detection unit is increased, it is determined that the positive switch unit is not in malfunction.

For example, in a power-off process of the high voltage circuit, the positive switch unit is turned off. That is, the state of the positive switch unit should be switched from an on state to an off state, and the desired state of the positive switch unit is the off state. During the switching process, the detection signal acquired from the first detection unit changes. Thus, if the detection signal acquired from the first detection unit remains unchanged, the actual state of the positive switch unit is in an on state. That is, the actual state of the positive switch unit does not coincide with the desired state, and it is determined that the positive switch unit is in malfunction. The desired operation state of the negative switch unit is either an on state or an off state.

If the actual operation unit of the positive switch unit is an off state, a resistance value of total resistance between the positive electrode of the battery pack and the reference voltage terminal before the positive switch unit is disconnected is smaller than a resistance value of total resistance between the positive electrode of the battery pack and the reference voltage terminal after the positive switch unit is disconnected. Therefore, the detection signal acquired from the first detection unit is increased, and the actual operation unit of the positive switch unit can be determined to be consistent with the desired operation state, and thus it is determined that the positive switch unit is not in malfunction.

It should be noted that, in other embodiments, whether the positive switch unit is in malfunction may also be determined by the detection signal acquired from the second detection unit. Specifically, the desired operation state of the positive switch unit is an off state, and the desired operation state of the negative switch unit is an off state or an on state. If the detection signal acquired from the second detection unit remains unchanged, it is determined that the positive switch unit is in malfunction. If the detection signal acquired from the second detection unit decreases, it is determined that the positive switch unit is not in malfunction.

Figure 5B:
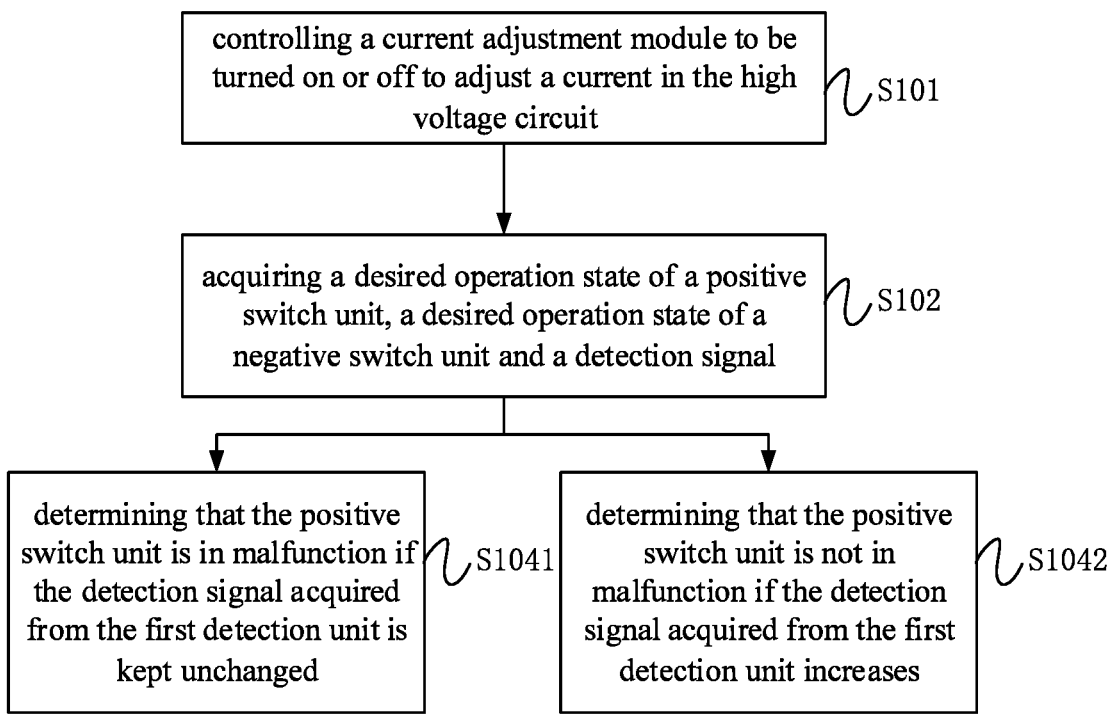
FIG. 5b is a flowchart of another specific implementation of a detection method in a high voltage detection circuit according to an embodiment of the present application.

For convenience of description, the step S103 in the above embodiment may be specifically implemented as the above steps S1041 to S1042 to obtain FIG. 5b. FIG. 5b is a flowchart of another specific implementation of a detection method in a high voltage detection circuit according to an embodiment of the present application. The difference between FIG. 5b and FIG. 3 is that the step S103 in the above embodiment is specifically implemented as the step S1041 to step S1042.

In step S1043, if the detection signal acquired from the second detection unit remains unchanged, it is determined that the negative switch unit is in malfunction.

In step S1044, if the detection signal acquired from the second detection unit is increased, it is determined that the negative switch unit is not in malfunction.

For example, in a power-off process of the high voltage circuit, the negative switch unit is turned off. That is, the state of the negative switch unit should be switched from an on state to an off state, and the desired state of the negative switch unit is the off state. During the switching process, the detection signal acquired from the second detection unit changes. Thus, if the detection signal acquired by the second detection unit remains unchanged, the actual state of the negative switch unit is in an on state. That is, the actual state of the negative switch unit does not coincide with the desired state, and thus it is determined that the negative switch unit is in malfunction. The desired operation state of the positive switch unit is either an on state or an off state.

If the actual operation unit of the negative switch unit is an off state, as compared with a resistance value of total resistance between the reference voltage terminal and the negative terminal of the battery pack before the negative switch unit is disconnected, the resistance value of total resistance between the reference voltage terminal and the negative terminal of the battery pack is increased after the negative switch unit is disconnected. Therefore, the detection signal acquired from the second detection unit is increased, and it can be determined that the actual operation state of the negative switch unit is consistent with the desired operation state, and thus it is determined that the negative switch unit is not in malfunction.

It should be noted that, in other embodiments, whether the negative switch unit is in malfunction may also be determined by the detection signal acquired from the first detection unit. Specifically, the desired operation state of the negative switch unit is an off state, and the desired operation state of the positive switch unit is an off state or an off state. If the detection signal acquired from the first detection unit remains unchanged, it is determined that the negative switch unit is in malfunction. If the detection signal acquired from the first detection unit decreases, it is determined that the negative switch unit is not in malfunction.

In step S1045, if the detection signal acquired from the first detection unit is greater than the detection signal acquired from the second detection unit, it is determined that the negative switch unit is in malfunction.

In step S1046, if the detection signal acquired from the first detection unit is smaller than or equal to the detection signal acquired from the second detection unit, it is determined that the negative switch unit is not in malfunction.

A total resistance value of all of the resistor sets in the first adjustment unit is equal to a total resistance value of all of the resistor sets in the first detection unit. A total resistance value of all of the resistor sets in the second adjustment unit is equal to a total resistance value of all of the resistor sets in the second detection unit. The total resistance value of all of the resistor sets in the second detection unit is smaller than the total resistance value of all of the resistor sets in the first detection unit but greater than one-half of the total resistance value of all of the resistor sets in the first detection unit. The desired operation state of the positive switch unit is an on state, and the desired operation state of the negative switch unit is an off state. The current adjustment module is turned on, specifically, the first adjustment unit and the second adjustment unit are turned on.

For example, in a power-off process of the high-voltage circuit, the negative switch unit is first disconnected, the positive switch unit has not been disconnected, the vehicle enters a power-off mode, and the vehicle capacitors $CY1$, $CY2$, and $CX1$ are accelerated to be discharged through the current adjustment module. As shown in FIG. 4, if the actual operation state of the negative switch unit is also off state, the total resistance value between the positive electrode of the battery pack and the reference voltage terminal is a series connection of the resistor set R1 and the resistor set R2 is connected in parallel with the insulation resistor Rp, and then is connected in parallel with the resistor set R5. There is only the resistor set R3 and the resistor set R4 between the reference voltage terminal and the negative electrode of the battery pack.

The detection signal acquired from the first detection unit is the voltage signal V1 between the resistor set R2 and the reference voltage terminal, and the detection signal acquired from the second detection unit is the voltage signal V2 between the resistor set R4 and the reference voltage terminal, where $V1 \leq V2$.

If the actual operation state of the negative switch unit is in an on state, then $V1 > V2$.

In step S1047, if the detection signal acquired from the first detection unit is smaller than the detection signal acquired from the second detection unit, it is determined that the positive switch unit is in malfunction.

In step S1048, if the detection signal acquired from the first detection unit is greater than or equal to the detection signal acquired from the second detection unit, it is determined that the positive switch unit is not in malfunction.

A total resistance value of all of the resistor sets in the first adjustment unit is equal to a total resistance value of all of the resistor sets in the first detection unit. A total resistance value of all of the resistor sets in the second adjustment unit is equal to a total resistance value of all of the resistor sets in the second detection unit. The total resistance value of all of the resistor sets in the second detection unit is smaller than the total resistance value of all of resistor sets in the first detection unit but greater than one-half of the total resistance value of all of the resistor sets in the first detection unit. The desired operation state of the positive switch unit is an off state, and the desired operation state of the negative switch unit is an off state. The current adjustment module is turned on, specifically, the first adjustment unit and the second adjustment unit are turned on.

For example, in a power-off process of the high voltage circuit, the negative switch unit is turned off first, and the positive switch unit is then turned off. After the negative switch unit is disconnected, the whole vehicle enters a power-off mode, and the vehicle capacitors $CY1$, $CY2$, and $CX1$ are accelerated to be discharged through the current adjustment module. After the positive switch unit is disconnected, the detection signal acquired from the first detection unit and the detection signal acquired from the second detection unit are compared.

If the actual operation state of the positive switch unit is an off state, the detection signal V1 acquired from the first detection unit is greater than or equal to the detection signal V2 acquired from the second detection unit, that is, $V1 \geq V2$.

If the actual operation state of the positive switch unit is an on state, the detection signal V1 acquired from the first detection unit is smaller than the detection signal V2 acquired from the second detection unit, that is, $V1 < V2$.

It should be noted that, from the above step S1031 to step S1032, or step S1033 to step S1034, or step S1035 to step S1036, or step S1037 to step S1038, step S1041 to step S1042, or step S1043 to step S1044, or step S1045 to step S1046, or step S1047 to step S1048, it can be determined that the positive switch unit is in malfunction in the case where the actual operation unit of the positive switch unit is inconsistent with the desired operation state of the positive switch unit, and the positive switch unit is not in malfunction in the case where the actual operation unit of the positive switch unit is consistent with the desired operation state of the positive switch unit. The switch unit has not failed. Therefore, it is possible to determine whether or not the positive switch unit is in malfunction based on the detection signal acquired from the first detection unit and the detection signal acquired from the second detection unit.

Similarly, the negative switch unit is in malfunction in the case where the actual operation unit of the negative switch unit is inconsistent with the desired operation state of the negative switch unit, and the negative switch unit is not in malfunction in the case where the actual operation unit of the negative switch unit is consistent with the desired operation state of the negative switch unit. Therefore, it is possible to determine whether or not the negative switch unit is in malfunction based on the detection signal acquired from the first detection unit and the detection signal acquired from the second detection unit.

It should be noted that, it is possible to perform a detection of the high voltage detection circuit based on variation trend of the detection signal acquired from the first detection unit or variation trend of the detecting signal obtained from the second detection unit, without waiting for complete discharge of the vehicle capacitors, whereby detection speed can be further improved.

In some examples, the high voltage detection circuit in the above embodiments may further include a detection signal adjustment module. One terminal of the detection signal adjustment module is connected to one of the first port of the first detection module and the second port of the first detection module, and the other terminal of the detection signal adjustment module is connected to the third port of the first detection module. The detection signal adjustment module is configured to adjust the detection signal acquired by the first detection module.

Specifically, the detection signal adjustment module includes a resistor set and a switch device connected in series. The number of resistor sets and switch devices as well as their location are not limited herein. The switch device in the detection signal adjustment module is turned on at an interval. In some examples, the switch device in the detection signal adjustment module may be turned on periodically.

Figure 6A:
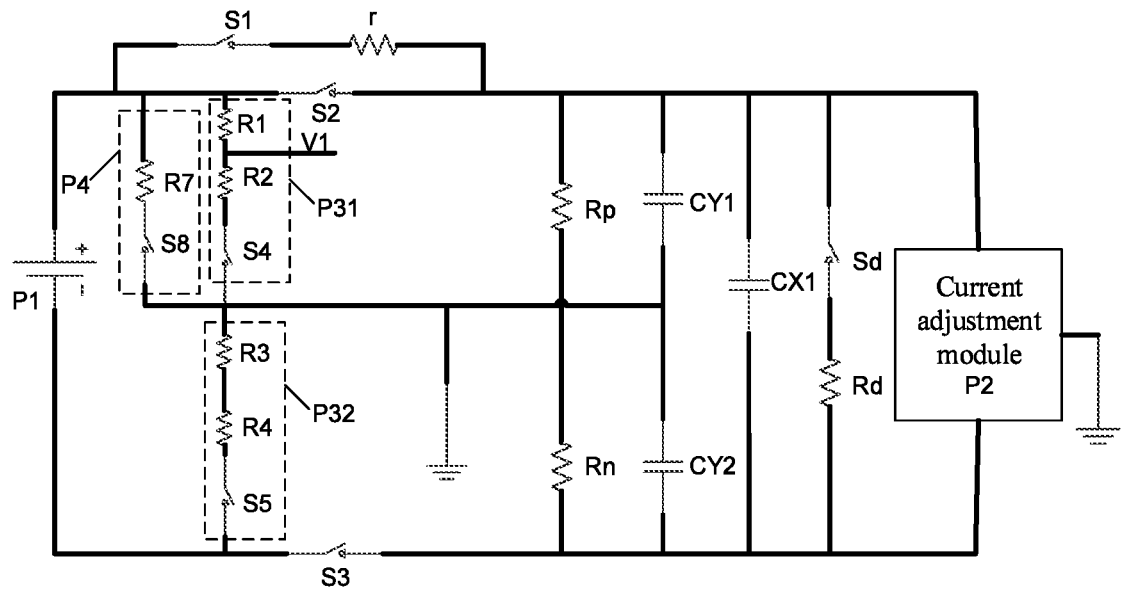
FIG. 6a is a schematic structural diagram of another specific implementation of a high voltage detection circuit according to an embodiment of the present application.

FIG. 6a is a schematic structural diagram of another specific implementation of a high voltage detection circuit according to an embodiment of the present application (the processor module is not shown). As shown in FIG. 6a, one terminal of the detection signal adjustment module is connected to the first port of the first detection module P3, and the other terminal of the detection signal adjustment module is connected to the third terminal of the first detection module P3. The detection signal adjustment module includes a resistor set R7 and a switch device S8 connected in series. The resistor set R7 is connected to the first port of the first detection module, and the switch device S8 is connected to the third port of the first detection module. In other examples, the location of resistor set R7 and switch device S8 may be reversed.

The detection signal supplied from the first detection unit P31 in the first detection module P3 may be varied by controlling the switch device S8 to be turned on or turned off. Thereby, it is possible to determine whether the positive switch unit is in malfunction according to a variable detection signal provided by the first detection unit P31 in the first detection module P3.

Figure 6B:
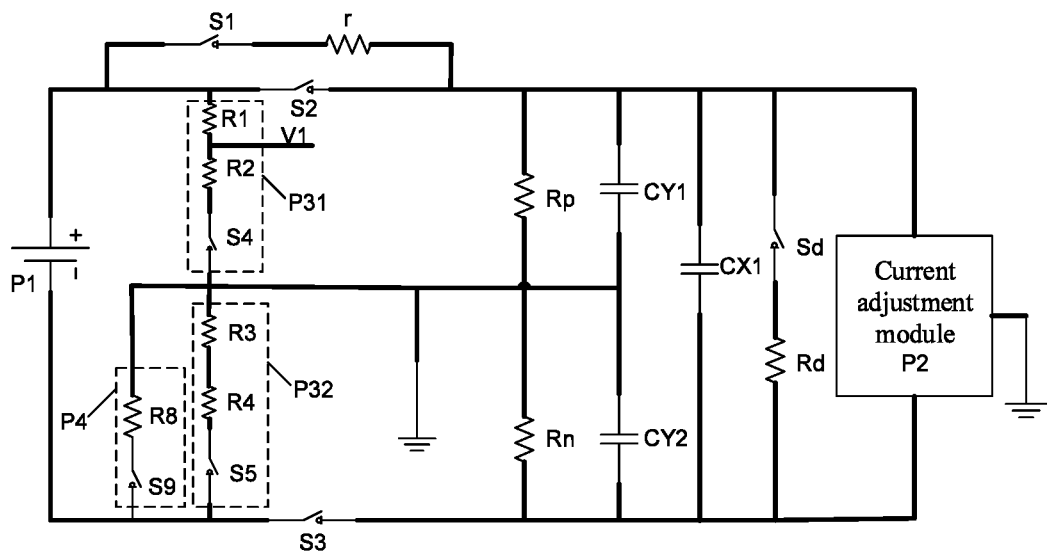
FIG. 6b is a schematic structural diagram of still another specific implementation of a high voltage detection circuit according to an embodiment of the present application.

FIG. 6b is a schematic structural diagram of still another specific implementation of a high voltage detection circuit according to an embodiment of the present application (the processor module is not shown). As shown in FIG. 6b, one terminal of the detection signal adjustment module is connected to the second port of the first detection module P3, and the other terminal of the detection signal adjustment module is connected to the third terminal of the first detection module P3. The detection signal adjustment module includes a resistor set R8 and a switch device S9 connected in series. The resistor set R8 is connected to the third port of the first detection module P3, and the switch device S9 is connected to the second port of the first detection module P3. In other examples, the location of resistor set R8 and switch device S9 may be reversed.

The detection signal supplied from the second detection unit P32 in the first detection module P3 may be varied by controlling the switch device S9 to be turned on or turned off. Thereby, it is possible to determine whether the negative switch unit is in malfunction according to a variable detection signal provided by the second detection unit P32 in the first detection module P3.

Figure 7:
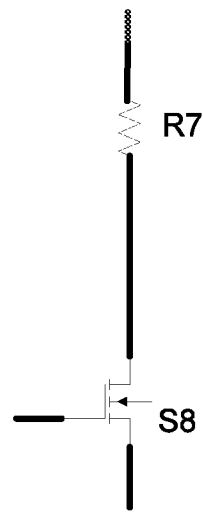
FIG. 7 is a schematic structural diagram illustrating a control device in a detection signal adjustment module is subjected to a control according to an embodiment of the present application.

FIG. 7 is a schematic structural diagram of a control device in a detection signal adjustment module being subject to a control according to an embodiment of the present application. As shown in FIG. 7, a control terminal of the switch device may be connected to the processor module to receive a pulse signal output by the processor module, such as a Pulse Width Modulation (PWM) signal. Thereby, the switch device in the detection signal adjustment module may be controlled to be turned on at an interval. As shown in FIG. 7, the switch device S8 may specifically be a switching transistor.

Figure 8:
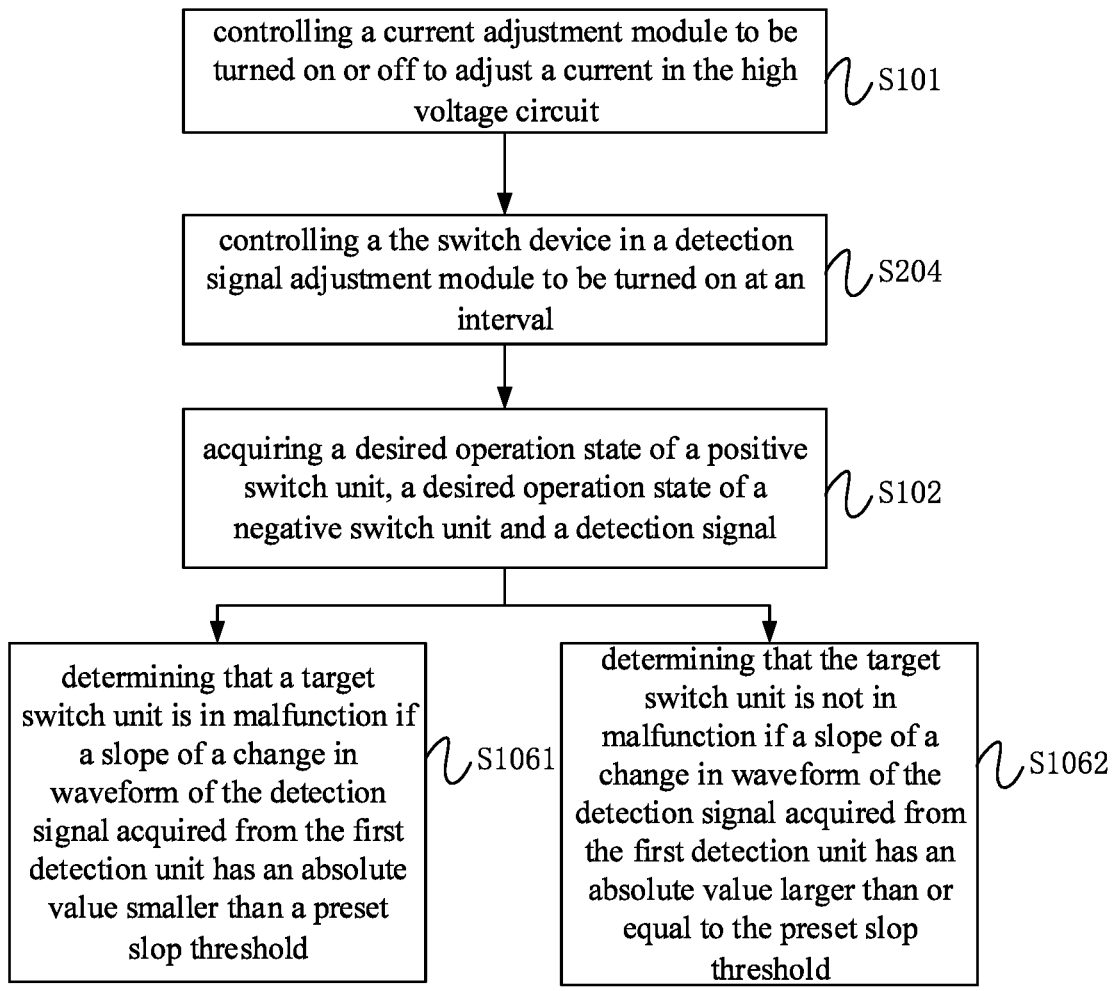
FIG. 8 is a flowchart of still another specific implementation of a detection method in a high voltage detection circuit according to an embodiment of the present application.

Corresponding to the high voltage detection circuit shown in FIG. 6a and FIG. 6b, FIG. 8 is a flowchart of still another specific implementation of a detection method in a high voltage detection circuit according to an embodiment of the present application. Based on the detection method in a high voltage detection circuit shown in FIG. 3, the detection method in a high voltage detection circuit may further include step S204. The step S103 in the above embodiment may be refined into steps S1061 and S1062.

In step S204, the switch device in the detection signal adjustment module is controlled to be turned on at an interval.

As for related contents about controlling of the switch device in the detection signal adjustment module to be turned on at an interval, please refer to the related description with respect to the above embodiments, and details are not described herein again.

In step S1061, if a slope of a change in waveform of the detection signal acquired from the first detection unit has an absolute value smaller than a preset slope threshold, it is determined that a target switch is in malfunction.

In step S1062, if a slope of a change in waveform of the detection signal acquired from the first detection unit has an absolute value greater than or equal to the preset slope threshold, it is determined that the target switch unit is not in malfunction.

In the case where one terminal of the detection signal adjustment module is connected to the first port of the first detection module, if the desired operation state of the positive switch unit is an off state and the desired operation state of the negative switch unit is an on state, the target switch unit is the positive switch unit.

In the case where one terminal of the detection signal adjustment module is connected to the second port of the first detection module, if the desired operation state of the positive switch unit is an on state and the desired operation state of the negative switch unit is an off state, the target switch unit is the negative switch unit.

The preset slope threshold may be set according to operation situation and operation requirements, and is not limited herein. In the high voltage circuit, there is an internal capacitor Y between the master positive switch S2 and the battery pack. When the negative switch unit is turned on and the positive switch unit is turned off, the resistance from the master positive switch S2 to the reference voltage terminal at the lower voltage side is increased, and the capacitance from the master positive switch S2 to the reference voltage terminal at the lower voltage side is decreased. The resistance of the detection signal adjustment module is relatively small, so the resistance between the master positive switch S2 and the battery pack is much smaller than the insulation impedance Rp from the master positive switch S2 to the reference voltage terminal at the lower voltage side. When the internal Y capacitor is equal to the vehicle Y capacitor CY1 from the master positive switch S2 to the reference voltage terminal at the lower voltage side and the vehicle Y capacitor CY2 from the master positive switch S2 to the reference voltage terminal at the lower voltage side, or the vehicle Y capacitor CY1 from the master positive switch S2 to the reference voltage terminal at the lower voltage side and the vehicle Y capacitor CY2 from the master positive switch S2 to the reference voltage terminal at the lower voltage side is greater than the internal Y capacitor, and a product of the resistance and the capacitance is reduced when the positive switch unit is turned off than when the positive switch unit is turned on, thereby, discharge of the high voltage circuit is accelerated, and the slope of change in a waveform of the detection signal is increased.

Figure 9A:
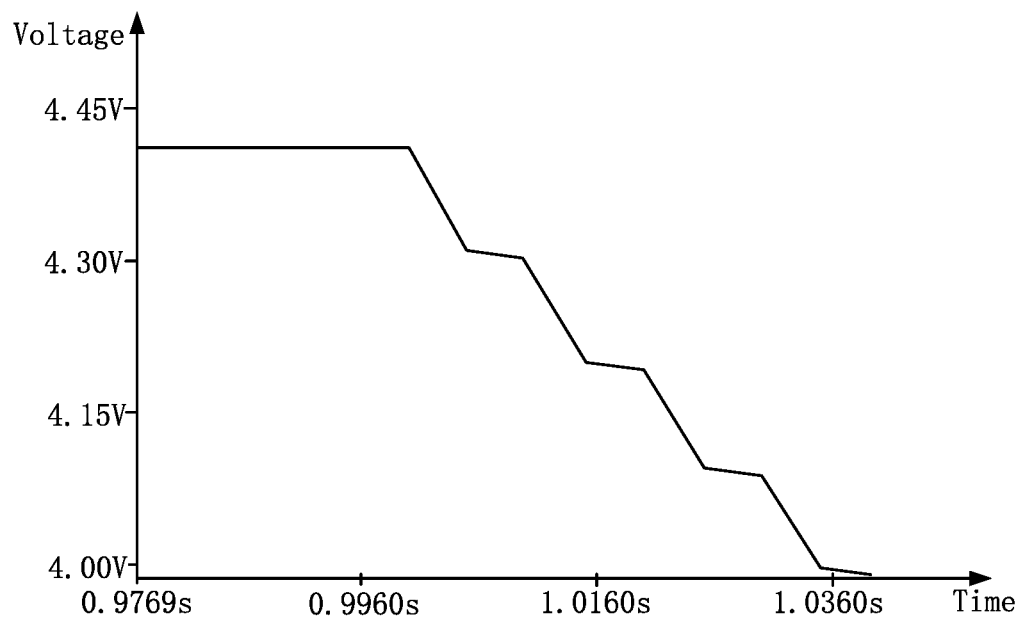
FIG. 9a is a waveform diagram of a detection signal acquired from a first detection unit when a desired operation state of a positive switch unit is an off state and an actual operation state of the positive switch unit is also in an off state according to an embodiment of the present application.
Figure 9B:
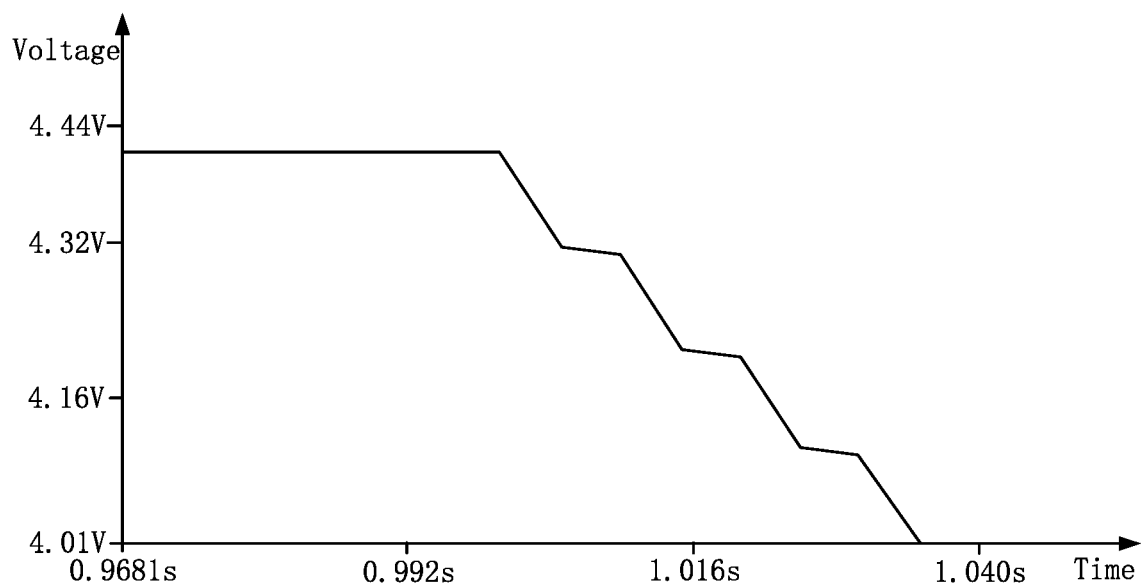
FIG. 9b is a waveform diagram of a detection signal acquired from a first detection unit when a desired operation state of a positive switch unit is an off state but an actual operation state of the positive switch unit is an on state.

For example, corresponding to the high voltage detection circuit shown in FIG. 6a, FIG. 9a is a waveform diagram of a detection signal acquired by the first detection unit in a case where a desired operation state of the positive switch unit is in an off state and an actual operation state of the positive switch unit is also in an off state. FIG. 9b is a waveform diagram of a detection signal acquired from a first detection unit in a case where a desired operation state of the positive switch unit is an off state but an actual operation state of the positive switch unit is in an on state. In the waveform of the detection signal as shown in FIG. 9a and FIG. 9b, the capacitance of the internal Y capacitor between the master positive switch and the battery pack in the high voltage detection circuit is 0.1 microfarad. In FIG. 9a and FIG. 9b, the horizontal axis is time with a unit of second (i.e., s), and the vertical axis is voltage with a unit of volt (i.e., V).

Figure 9C:
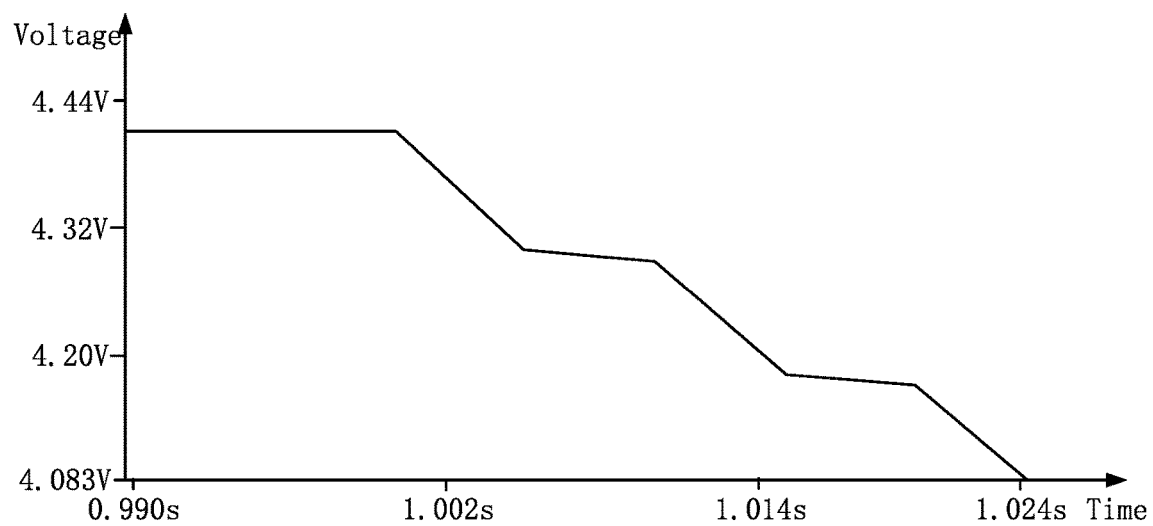
FIG. 9c is a waveform diagram of a detection signal acquired from a first detection unit when a desired operation state of a positive switch unit is an off state and an actual operation state of the positive switch unit is also an off state according to an embodiment of the present application.
Figure 9D:
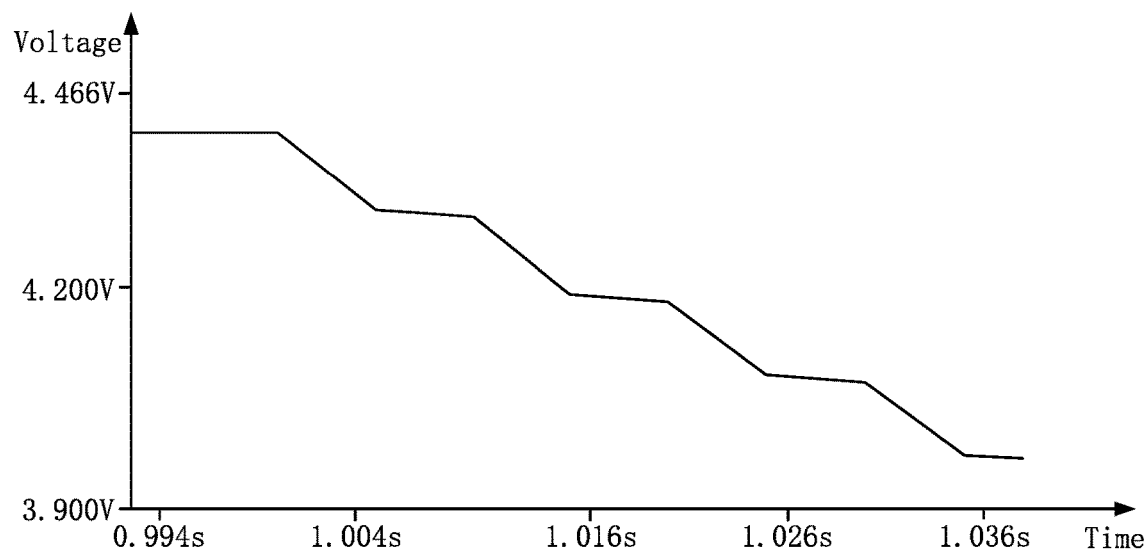
FIG. 9d is a waveform diagram of a detection signal acquired from a first detection unit when a desired operation state of a positive switch unit is an off state but an actual operation state of the positive switch unit is an on state.

FIG. 9c is a waveform diagram of a detection signal acquired from a first detection unit in a case where a desired operation state of the positive switch unit is an off state and an actual operation state of the positive switch unit is also in an off state. FIG. 9d is a waveform diagram of a detection signal acquired from a first detection unit in a case where a desired operation state of the positive switch unit is an off state but an actual operation state of the positive switch unit is in an on state. In the waveform of the detection signal as shown in FIG. 9c and FIG. 9d, the capacitance of the internal Y capacitor between the master positive switch and the battery pack in the high voltage detection circuit is 0.001 microfarad. In FIG. 9c and FIG. 9d, the horizontal axis is time with a unit of second (i.e., s), and the vertical axis is voltage with a unit of volt (i.e., V)

As can be seen from the waveforms in FIG. 9a and FIG. 9b, change extent of the falling edge of the waveform in FIG. 9a is more severe than change extent of the falling edge of the waveform in FIG. 9b. That is, the falling edge of the waveform in FIG. 9a is relatively steeper, while the falling edge of the waveform in FIG. 9b is relatively more moderate. Similarly, as can be seen from the waveforms in FIG. 9c and FIG. 9d, change extent of the falling edge of the waveform in FIG. 9c is more severe than change extent of the falling edge of the waveform in FIG. 9d. That is, the falling edge of the waveform in FIG. 9c is relatively steeper, while the falling edge of the waveform in FIG. 9d is relatively more moderate.

Moreover, as shown in FIG. 9a to FIG. 9d, the smaller the internal Y capacitor is, the steeper the waveform of the detection signal acquired form the first detection unit in a case where a desired operation state of the positive switch unit is an off state and an actual operation state of the positive switch unit is also an off state is.

The waveform diagram of the detection signal acquired from the first detection unit in the high voltage detection circuit shown in FIG. 6b is similar to that of FIG. 9a to FIG. 9d, and will not be described again.

It should be note that it is possible to perform a detection of the high voltage detection circuit based on a waveform of a detection signal acquired by the first detection unit, without waiting for complete discharge of vehicle capacitors, whereby detection speed can be further improved.

Figure 10:
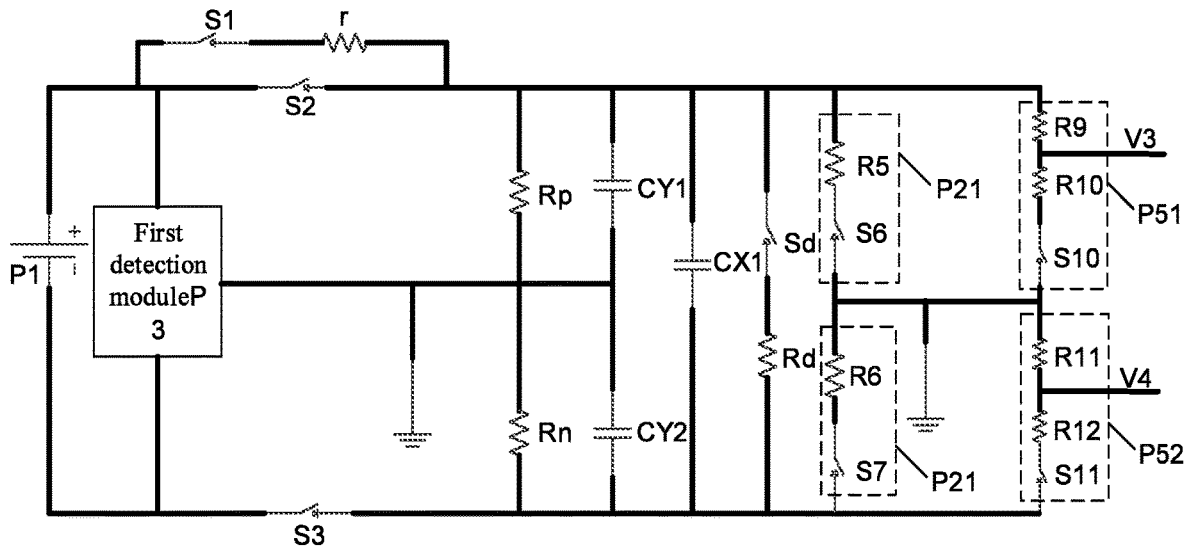
FIG. 10 is a schematic structural diagram of still another specific implementation of a high voltage detection circuit according to an embodiment of the present application.

FIG. 10 is a schematic structural diagram of still another specific implementation of a high voltage detection circuit according to an embodiment of the present application (the processor module is not shown). As shown in FIG. 10, the high voltage detection circuit shown in FIG. 10 may further include a second detection module. The second detection module includes a third detection unit P51 and a fourth detection unit P52.

One terminal of the third detection unit P51 is connected to the first port of the current adjustment module P2, the other terminal of the third detection unit P51 is connected to the third port of the current adjustment module P2, and the third detection unit P51 includes a resistor set or a series connection of a resistor set and a switch device. If the third detection unit P51 includes a switch device, which controls the third detection unit P51 to be turned on or off. The number of resistor sets and the number of switch devices in the third detection unit P51 are not limited herein. The positional relationship between the switch device and the resistor set is also not limited. For example, as shown in FIG. 10, the third detection unit P51 includes a resistor set R9 and a resistor set R10, and a switch device S10. The switch device S10 is located between the resistor set R10 and the third port of the current adjustment module P2, and the resistor set R9, the resistor set R10 and the switch device S10 are connected in series. In other examples, the resistor set R9, the resistor set R10 and the switch device S10 may be connected in a different order, which is not limited herein.

One terminal of the fourth detection unit P52 is connected to the third port of the current adjustment module P2, the other terminal of the fourth detection unit P52 is connected to the second port of the current adjustment module P2, and the fourth detection unit P52 includes a resistor set or a series connection of a resistor set and a switch device. If the fourth detection unit P52 includes a switch device, which controls the fourth detection unit P52 to be turned on or off. The number of resistor sets and the number of switch devices in the fourth detection unit P52 are not limited herein. The positional relationship between the switch device and the resistor set is also not limited. For example, as shown in FIG. 10, the fourth detection unit P52 includes a resistor set R11 and a resistor set R12 and a switch device S11. The switch device S11 is located between the resistor set R12 and the second port of the current adjustment module P2, and the resistor set R11, the resistor set R12 and the switch device S11 are connected in series. In other examples, the resistor set R11, the resistor set R12 and the switch device S11 may be connected in a different order, which is not limited herein.

The processor module is further configured to acquire a detection signal from the third detection unit P51. The detection signal acquired by the processor module from the third detection unit P51 is a voltage signal between at least one resistor set of the third detection unit P51 and the reference voltage terminal. For example, as shown in FIG. 10, a point for acquiring a detection signal by the processor module from the third detection unit P51 may be disposed between the resistor set R9 and the resistor set R10. If the switch device S10 is turned on, the detection signal acquired by the processor module from the third detection unit P51 is the voltage signal V3 between the resistor set R10 and the reference voltage terminal, that is, the voltage signal V3 across the resistor set R10. In some examples, the detection signal acquired by the processor module from the third detection unit P51 may also be a voltage signal between at least one resistor set of the third detection unit P51 and the negative electrode of the battery pack P1.

The processor module is further configured to acquire a detection signal from the fourth detection unit P52. The detection signal acquired by the processor module from the fourth detection unit P52 is a voltage signal between at least one resistor set of the fourth detection unit P52 and the reference voltage terminal. For example, as shown in FIG. 10, point for acquiring a detection signal by the processor module from the fourth detection unit P52 may be disposed between the resistor set R11 and the resistor set R12. If the switch device S11 is turned on, the detection signal acquired by the processor module from the fourth detection unit P52 is the voltage signal V4 between the resistor set R12 and the reference voltage terminal, that is, the voltage signal V4 across the resistor set R12. In some examples, the detection signal acquired by the processor module from the fourth detection unit P52 may also be a voltage signal between at least one resistor set of the fourth detection unit P52 and the negative electrode of the battery pack P1.

Next, a detection method in a high voltage detection circuit will be described by taking the high voltage detection circuit shown in FIG. 10 as an example. Step S103 in the above embodiment may be specifically refined into step S1063 and step S1064, step S1065 and step S1066, step S1067 and step S1068, and/or step S1071 and step S1072.

In step S1063, in a case where the third detection unit is turned on, if a detection signal acquired from the third detection unit remains unchanged, it is determined that a target switch is in malfunction.

In step S1064, if the detection signal acquired from the third detection unit continuously decreases, it is determined that the target switch is not in malfunction.

If a desired operation state of the positive switch unit is an off state, a desired operation state of the negative switch unit is an on state, the target switch is the positive switch unit. For example, in a power-off process of the high-voltage circuit, the positive switch unit is first disconnected, the whole vehicle enters a power-off mode, and the vehicle capacitors CY1, CY2, and CX1 are discharged through the third detection unit. As shown in FIG. 10, during discharge of the third detection unit, voltages on the vehicle capacitors CY1, CY2, and CX1 become smaller and smaller, and a voltage signal V3 across the resistor set R10 also gradually decreases, and thus it can be determined that an actual operation state of the positive switch unit is an off state. If the voltages on the vehicle capacitors CY1, CY2, and CX1 remains unchanged, the voltage signal V3 across the resistor set R10 is also unchanged, and thus it can be determined that an actual operation state of the positive switch unit is an on state.

If the desired operation state of the positive switch unit is an on state, the desired operation state of the negative switch unit is an off state, the target switch is the negative switch unit. For example, in a power-off process of the high voltage circuit, the negative switch unit is first disconnected, the whole vehicle enters a power-off mode, and the vehicle capacitors CY1, CY2, and CX1 are discharged through the third detection unit. As shown in FIG. 10, during discharge of the third detection unit, voltages on the vehicle capacitors CY1, CY2, and CX1 become smaller and smaller, and the voltage signal V3 across the resistor set R10 gradually decreases, and thus it can be determined that an actual operation unit of the negative switch unit is an off state. If the voltages on the vehicle capacitors CY1, CY2, and CX1 remains unchanged, the voltage signal V3 across the resistor set R10 is also unchanged, and thus it can be determined that an actual operation state of the negative switch unit is an on state.

Figure 11A:
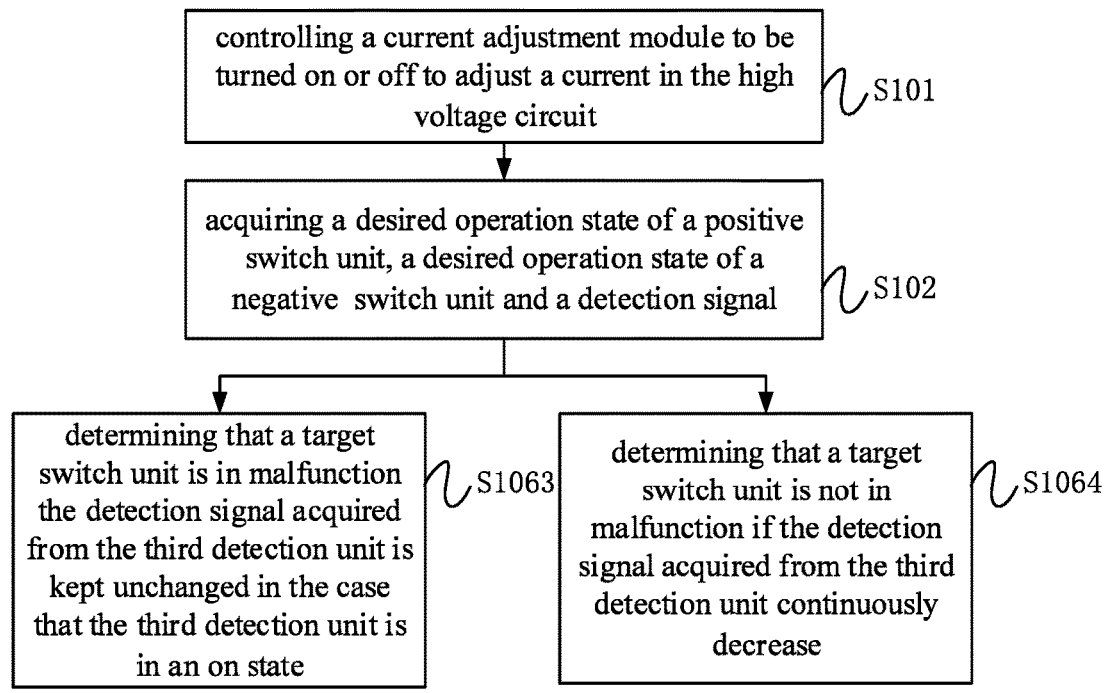
FIG. 11a is a flowchart of still another specific implementation of a detection method in a high voltage detection circuit according to an embodiment of the present application.

For convenience of description, step S103 in the above embodiment may be specifically implemented as the above steps S1063 to S1064 so as to obtain FIG. 11a. FIG. 11a is a flowchart of still another specific implementation of a detection method in a high voltage detection circuit according to an embodiment of the present application. The difference between FIG. 11a and FIG. 3 is that step S103 in the above embodiment may be specifically implemented as step S1063 to step S1064.

In step S1065, in a case where the fourth detection unit is turned on, if the detection signal acquired from the fourth detection unit remains unchanged, it is determined that a target switch is in malfunction.

In step S1066, if the detection signal acquired from the fourth detection unit continually decreases, it is determined that the target switch is not in malfunction.

The detection method for determining whether a target switch is in function by the fourth detection unit in step S1065 and step S1066 is similar to the detection method for determining whether a target switch is in malfunction by the third detection unit in step S1063 and step S1064, and details are not described herein again.

In step S1067, in a case where the third detection unit is connected, if the detection signal acquired from the third detection unit is greater than a first preset voltage threshold, it is determined that either the positive switch unit or the negative switch unit is in malfunction.

In step S1068, if the detection signal acquired from the third detection unit is smaller than or equal to the first preset voltage threshold, it is determined that both the positive switch unit and the negative switch unit are not in malfunction.

If a desired operation state of the positive switch unit is an off state, a desired operation state of the negative switch unit is an off state. For example, in a power-off process of the high voltage circuit, the negative switch unit is first disconnected, the whole vehicle enters a power-off mode, and the vehicle capacitors CY1, CY2, and CX1 are discharged through the third detection unit. Then the positive voltage switch is turned off. As shown in FIG. 10, after a delay period, whether the voltage signal V3 across the resistor set R10 is greater than the first preset voltage threshold is detected. The first preset voltage threshold may be set according to duration of the delay. If the duration of the delay is sufficient for the vehicle capacitors CY1, CY2 and CX1 to be discharged completely, the first preset voltage threshold may be zero. If the duration of the delay is not enough for the vehicle capacitors CY1, CY2 and CX1 to be discharged completely, the first preset voltage threshold may be appropriately increased from 0. Assuming that the first preset voltage threshold is 0, if it is detected that the voltage signal across the resistor set R10 V3>0, it can be determined that an actual operation state of the positive switch unit is in an on state, that is, it can be determined that the positive switch unit is in malfunction. If it is detected that the voltage signal across the resistor set R10 V3=0, it can be determined that an actual operation unit of the positive switch unit is an off state, that is, it can be determined that the positive switch unit is not in malfunction.

Similarly, in a power-off process of the high voltage circuit, the positive switch unit is first disconnected, the whole vehicle enters a power-off mode, and the vehicle capacitors CY1, CY2, and CX1 are discharged through the third detection unit. Then the negative switch unit is turned off. As shown in FIG. 10, whether the negative switch unit is in malfunction can be determined by comparing the voltage signal V3 across the resistor set R10 with the first preset voltage threshold. The detection method for determining whether the negative switch unit is in malfunction is similar to the detection method for determining whether the positive switch unit is in malfunction as discussed above, and details are not described herein again.

It should be noted that in a power-off process of the high voltage circuit, it is possible to perform a detection of the high voltage detection circuit in a case where one of the positive switch unit and the negative switch unit is disconnected first, without waiting for complete discharge of the vehicle capacitors, whereby detection speed can be further improved.

Figure 11B:
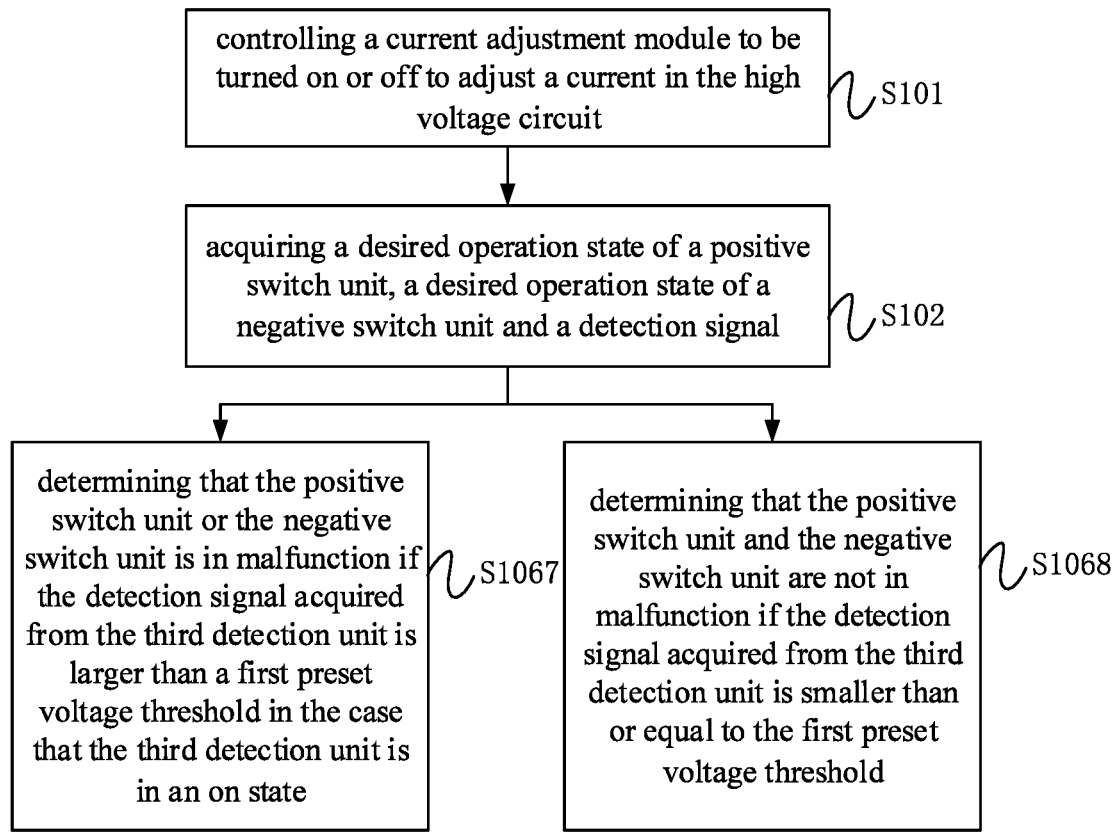
FIG. 11b is a flowchart of still another specific implementation of a detection method in a high voltage detection circuit according to an embodiment of the present application.

For convenience of description, step S103 in the above embodiment may be specifically implemented as the above steps S1067 to S1068 so as to obtain FIG. 11b. FIG. 11b is a flowchart of still another specific implementation of a detection method in a high voltage detection circuit according to an embodiment of the present application. The difference between FIG. 11b and FIG. 3 is that step S103 in the above embodiment may be specifically implemented as step S1067 to step S1068.

In step S1071, in a case where the fourth detection unit is turned on, if the detection signal acquired from the fourth detection unit is greater than a second voltage threshold, it is determined that either the positive switch unit or the negative switch unit is in malfunction.

In step S1072, if the detection signal acquired from the fourth detection unit is smaller than or equal to the second preset voltage threshold, it is determined that both the positive switch unit and the negative switch unit are not malfunction.

The detection method for determining whether a target switch is in malfunction by the fourth detection unit in step S1071 and step S1072 is similar to the detection method for determining whether a target switch is in malfunction by the third detection unit in step S1067 and step S1068, and details are not described herein again. The second preset voltage threshold may be set in a similar way as that for the first preset voltage threshold, and will not be described here.

Figure 12:
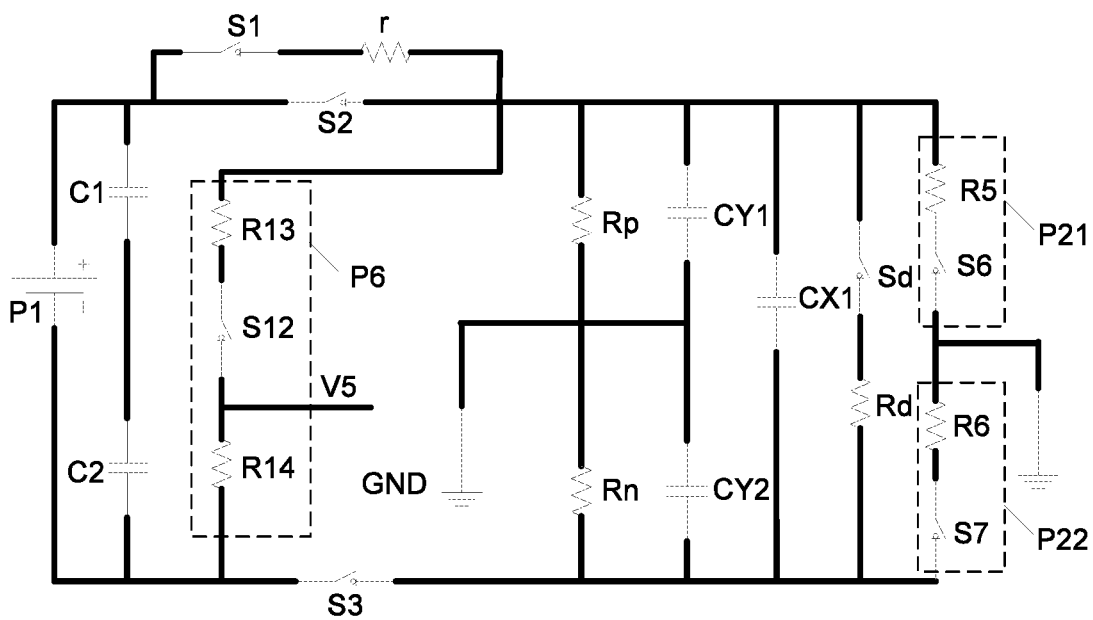
FIG. 12 is a schematic structural diagram of still another specific implementation of a high voltage detection circuit according to an embodiment of the present application.

FIG. 12 is a schematic structural diagram of still another specific implementation of a high voltage detection circuit according to an embodiment of the present application (the first detection module and the processor module are not shown). As shown in FIG. 12, the high voltage detection circuit may further includes a third detection module P6.

A first port of the third detection module P6 is connected to one terminal of the master positive switch S2 where the master positive switch is connected to the load, and a second port of the third detection module P6 is connected to one terminal of the master negative switch S3 where the master negative switch is connected to the battery pack P1. The processor module is further configured to acquire a detection signal from the third detection module P6.

In some examples, the third detection module P6 includes a series connection of resistor sets, or a series connection of resistor sets and a switch device. The number of resistor sets and the number of switch devices are not limited herein. The positional relationship between the switch device and the resistor set is also not limited.

A detection signal acquired by the processor module from the third detection module P6 is a voltage signal between at least one resistor set of the third detection module P6 and the negative electrode of the battery pack P1. For example, as shown in FIG. 12, the third detection module P6 includes a resistor set R13, a resistor set R14, and a switch device S12. The switch device S12 is located between the resistor set R13 and the resistor set R14. In other examples, the resistor set R13, the resistor set R12, and the switch device S12 may be connected in a different order, which is not limited herein. The capacitors C1 and C2 shown in FIG. 12 are the internal Y capacitor between the positive switch and the battery pack P1, and between the master negative switch and the battery pack P1, respectively.

A point for acquiring the detection signal provided by the third detection module P6 may be disposed between the switch device S12 and the resistor set R14. The detection signal provided by the third detection module P6 is the voltage signal V5 between the resistor set R14 and the cathode of the battery pack P1, that is, the voltage signal V5 across the resistor set R14.

Figure 13:
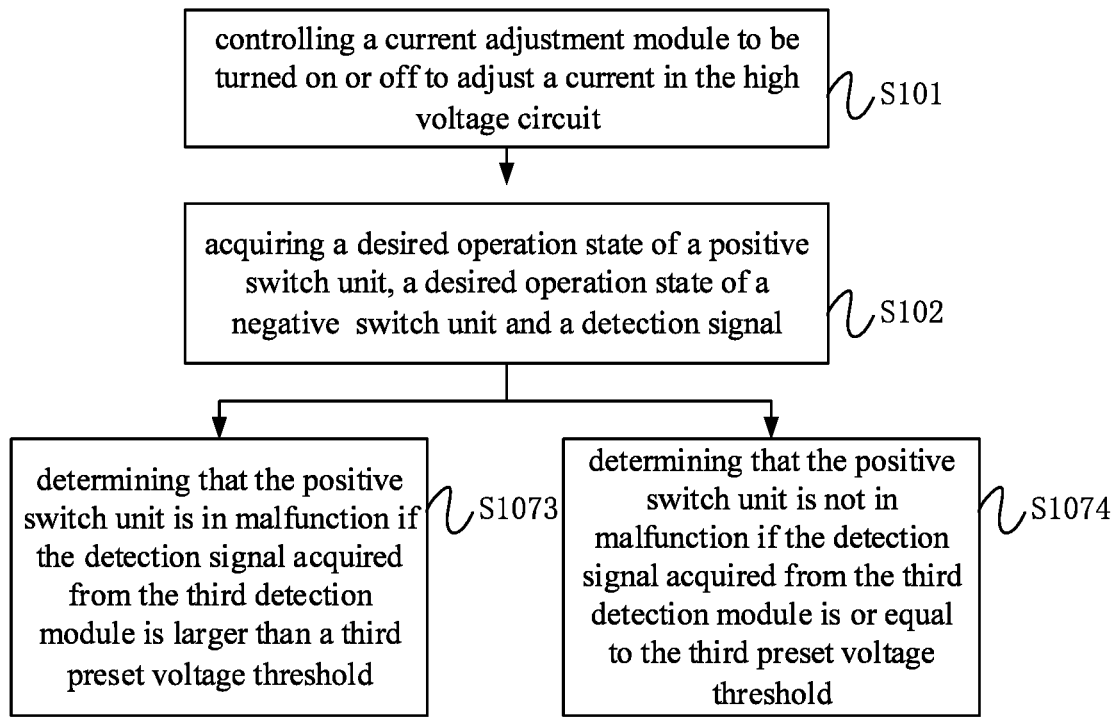
FIG. 13 is a flowchart of another specific implementation of a detection method in a high voltage detection circuit according to an embodiment of the present application.

Next, a detection method in a high voltage detection circuit will be described by taking the high voltage detection circuit shown in FIG. 12 as an example. FIG. 13 is a flowchart of another specific implementation of a detection method in a high voltage detection circuit according to an embodiment of the present application. FIG. 13 is different from FIG. 3 in that step S103 in the above embodiment can be specifically refined into step S1073 and step S1074.

In step S1073, if a detection signal acquired from the third detection module is greater than a third preset voltage threshold, it is determined that the positive switch unit is in malfunction.

In step S1074, if the detection signal acquired from the third detection module is smaller than or equal to the third preset voltage threshold, it is determined that the positive switch unit is not in malfunction.

The desired operation state of the positive switch unit is an off state. For example, in a power-off process of the high voltage circuit, the positive switch unit is first turned off, and after a delay period, the detection steps S1073 to S1074 are performed. Alternatively, the negative switch unit is turned off first, and the positive switch unit is then turned off, and the detection steps S1073 to S1074 are then performed. As shown in FIG. 12, if a detection signal V5 obtained from the third detection module is greater than the third preset voltage threshold, it indicates that a communication path formed by the battery pack, the positive switch unit, and the third detection module is not disconnected, and it can be determined that an actual operation state of the positive electrode is an on state, which is inconsistent with the desired operation state, and thus it is determined that the positive switch unit is in malfunction. If the detection signal V5 obtained from the third detection module is smaller than or equal to the third preset voltage threshold, it indicates that the communication path formed by the battery pack, the positive switch unit and the third detection module is disconnected, and it can be determined that an actual operation unit of the positive switch unit is an off state, which is consistent with the desired operation state, and thus it is determined that the positive switch unit is not in malfunction.

The third preset voltage threshold may be set according to a specific operation situation and operation requirements, and is not limited herein. For example, the third preset voltage threshold may be zero.

Alternatively, the positive switch unit may be turned off first to detect whether the detection signal V5 obtained from the third detection module decreases. If the detection signal V5 obtained from the third detection module decreases, it can be determined that the positive switch unit is not in malfunction.

Figure 14:
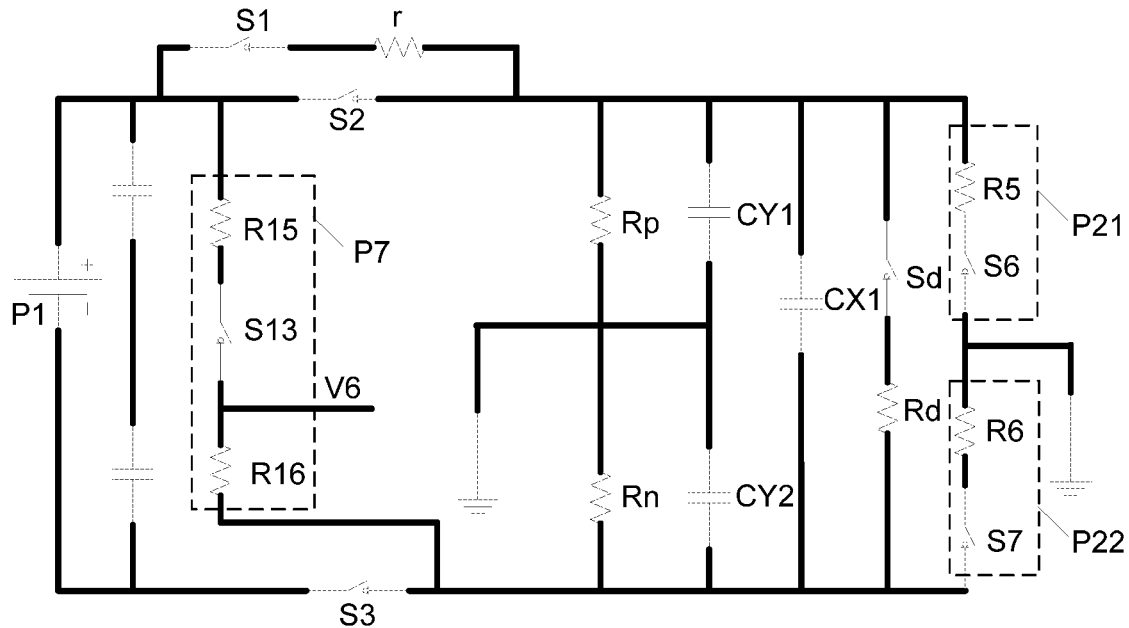
FIG. 14 is a schematic structural diagram of still another specific implementation of a high voltage detection circuit according to an embodiment of the present application.

FIG. 14 is a schematic structural diagram of still another specific implementation of a high voltage detection circuit according to an embodiment of the present application (the first detection module and the processor module are not shown). As shown in FIG. 14, the high voltage detection circuit may further includes a fourth detection module P7.

A first port of the fourth detection module P7 is connected to one terminal of the master positive switch S2 where the master positive switch is connected to the battery pack P1, and a second port of the fourth detection module P7 is connected to one terminal of the master negative switch S3 where the master negative switch is connected to the load. The processor module is further configured to acquire a detection signal from the fourth detection module P7.

In some examples, the fourth detection module P7 includes a series of resistor sets, or a series connection of resistor sets and a switch device. The number of resistor sets and the number of switch devices are not limited herein. The positional relationship between the switch device and the resistor set is also not limited.

A detection signal acquired by the processor module from the fourth detection module P7 is a voltage signal between at least one resistor set of the fourth detection module P7 and the negative electrode of the battery pack P1. For example, as shown in FIG. 14, the fourth detection module P7 includes a resistor set R15, a resistor set R16, and a switch device S13. Switch device S13 is located between resistor set R15 and resistor set R16. In other examples, the resistor set R15, the resistor set R16, and the switch device S13 may be connected in a different order, which is not limited herein. The capacitors C3 and C4 shown in FIG. 13 are the internal Y capacitor between the master positive switch and the battery pack P1, and between the master negative switch and the battery pack P1, respectively.

A point for acquiring a detection signal by the processor module from the fourth detection module P7 may be disposed between the switch device S13 and the resistor set R16. The detection signal provided by the fourth detection module is a voltage signal V6 between the resistor set R16 and the negative electrode of the battery pack P1, that is, the voltage signal V6 across the resistor set R16.

Figure 15:
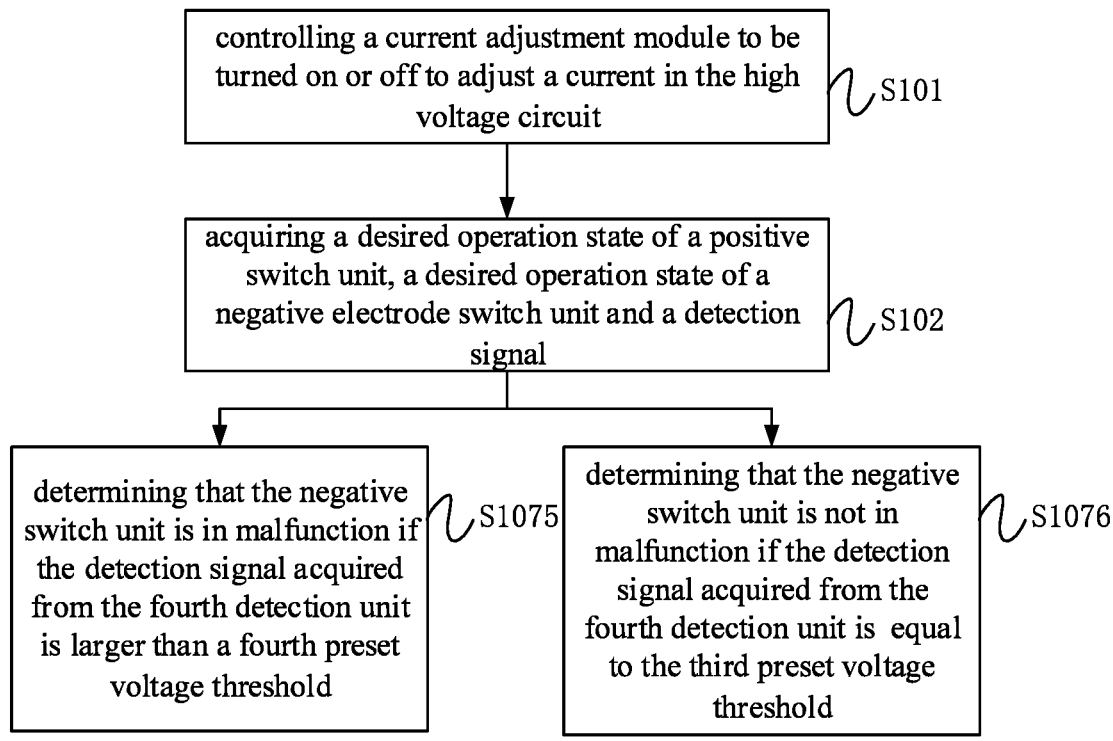
FIG. 15 is a flowchart of still another specific implementation of a detection method in a high voltage detection circuit according to an embodiment of the present application.

Next, a detection method in high voltage detection circuit will be described by taking the high voltage detection circuit shown in FIG. 14 as an example. FIG. 15 is a flowchart of still another specific implementation of a detection method in a high voltage detection circuit according to an embodiment of the present application. The difference between FIG. 15 and FIG. 3 is that step S103 in the above embodiment may be specifically refined to step S1075 and step S1076.

In step S1075, if a detection signal acquired from the fourth detection module is greater than a fourth preset voltage threshold, it is determined that the negative switch unit is in malfunction.

In step S1076, if the detection signal acquired from the fourth detection module is smaller than or equal to the fourth preset voltage threshold, it is determined that the negative switch unit is not in malfunction.

The desired operation state of the negative switch unit is an off state. For example, in the process of power-down of the high voltage circuit, the negative switch unit is first turned off. Alternatively, the positive switch unit is turned off first, and the negative switch unit is then turned off. As shown in FIG. 14, if the detection signal V6 acquired from the fourth detection module is greater than the fourth preset voltage threshold, it indicates that the communication path formed by the battery pack, the fourth detection module, and the negative switch unit is not disconnected, and it can be determined that an actual operation state of the negative electrode is an on state, which is inconsistent with the desired operation state, and thus it is determined that the negative switch unit is in malfunction. If the detection signal V6 acquired from the fourth detection module is smaller than or equal to the fourth preset voltage threshold, it indicates that the communication path formed by the battery pack, the fourth detection module and the negative switch unit is disconnected, and it can be determined that an actual operation unit of the negative switch unit is an off state, which is consistent with the desired operation state, and thus it is determined that the negative switch unit is not in malfunction.

The fourth preset voltage threshold may be set according to a specific operation situation and operation requirements, and is not limited herein. For example, the fourth preset voltage threshold may be zero.

In some examples, the processor module may also acquire detection signals from the first adjustment unit and the second adjustment unit in the above embodiments. The processor module may also perform a detection of the high voltage circuit according to the detection signals acquired from the first adjustment unit and the second adjustment unit, the desired operation state of the positive switch unit and the desired operation state of the negative switch unit, and determine whether the positive switch unit or the negative switch unit is in a malfunction.

Figure 16:
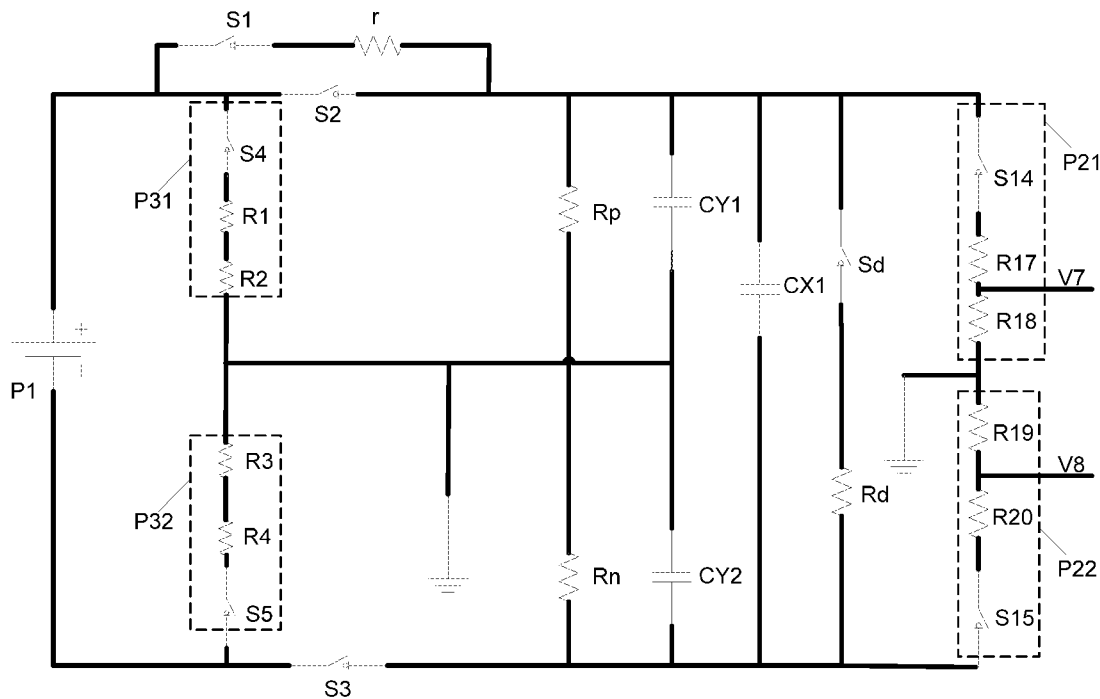
FIG. 16 is a schematic structural diagram of still another specific implementation of a high voltage detection circuit according to an embodiment of the present application.

FIG. 16 is a schematic structural diagram of still another specific implementation of a high voltage detection circuit according to an embodiment of the present application (a processor module is not shown). The processor module may also acquire a detection signal from the first adjustment unit P21, and the processor module may also acquire a detection signal from the second adjustment unit P22.

The detection signal acquired by the processor module from the first adjustment unit P21 is a voltage signal between at least one resistor set of the first adjustment unit P21 and a reference voltage terminal. The detection signal acquired by the processor module from the second adjustment unit P22 is a voltage signal between at least one resistor set of the second adjustment unit P22 and the reference voltage terminal.

For example, as shown in FIG. 16, the first adjustment unit P21 includes a switch device S14, a resistor set R17 and a resistor set R18 connected in series. The switch device S14 is located between the master positive switch S2 and the resistor set R17. The second adjustment unit P22 includes a resistor set R19, a resistor set R20 and a switch device S15 connected in series. The switch device S15 is located between the master negative switch and the resistor set R20.

A point for acquiring the detection signal acquired by the processor module from the first adjustment unit P21 may be set between the resistor set R17 and the resistor set R18. If the switch device S14 is turned on, the detection signal acquired by the processor module from the first adjustment unit P21 is the voltage signal V7 between the resistor set R18 and the reference voltage terminal. In some examples, the detection signal acquired by the processor module from the first adjustment unit P21 may also be a voltage signal between at least one resistor set of the first adjustment unit P21 and the negative electrode of the battery pack P1.

A point for acquiring the detection signal acquired by the processor module from the second adjustment unit P22 may be set between the resistor set R19 and the resistor set R20. If the switch device S15 is turned on, the detection signal obtained by the processor module from the second adjustment unit P22 is the voltage signal V8 between the resistor set R19 and the reference voltage terminal. In some examples, the detection signal acquired by the processor module from the second adjustment unit P22 may also be a voltage signal between at least one resistor set of the second adjustment unit P22 and the negative electrode of the battery pack P1.

Next, a detection method in a high voltage detection circuit will be described by taking the high voltage detection circuit shown in FIG. 16 as an example. Step S103 in the above embodiment may be specifically refined into steps S1077 to S1078, and/or steps S1081 to S1082.

In step S1077, in a case where the first adjustment unit is turned on, if the detection signal acquired from the first adjustment unit remains unchanged, it is determined that a target switch is in malfunction.

In step S1078, if the detection signal acquired from the first adjustment unit continuously decreases, it is determined that the target switch is not in malfunction.

In step S1081, in a case where the second adjustment unit is turned on, if the detection signal acquired from the second adjustment unit remains unchanged, it is determined that a target switch is in malfunction.

In step S1082, if the detection signal acquired from the second adjustment unit continuously decreases, it is determined that the target switch is not in malfunction.

If the desired operation state of the positive switch unit is an off state, the desired operation state of the negative switch unit is an on state, the target switch is the positive switch unit. If the desired operation state of the positive switch unit is an on state, the desired operation state of the negative switch unit is an off state, the target switch is the negative switch unit.

Figure 17:
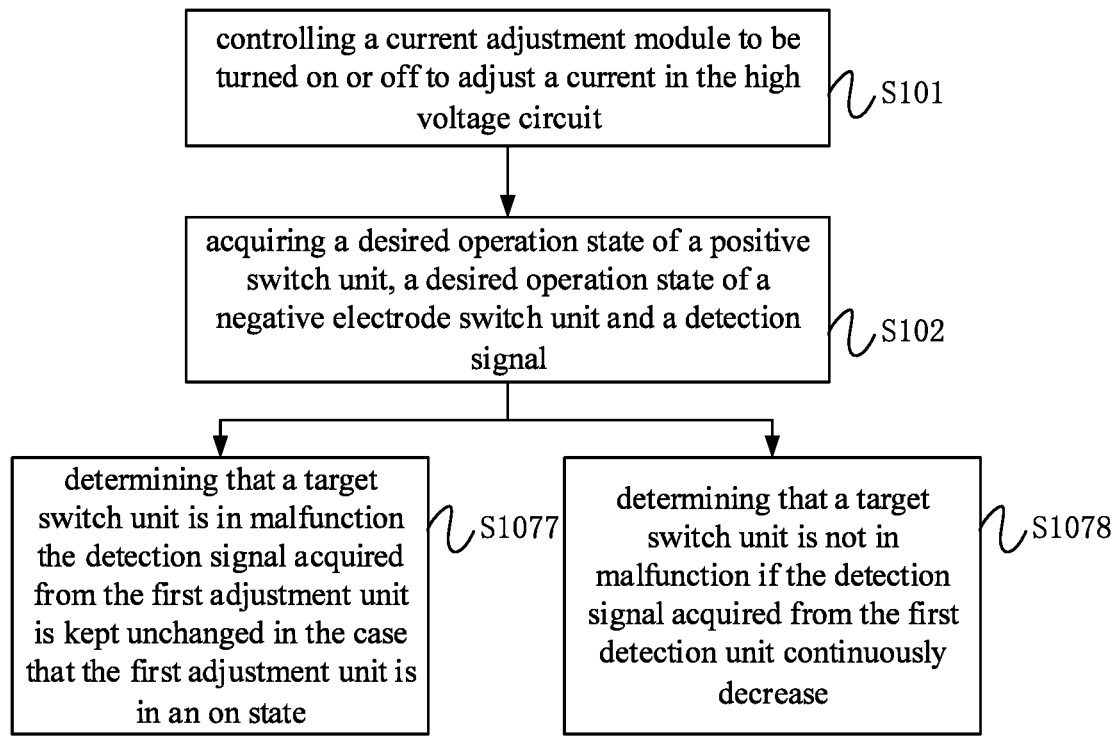
FIG. 17 is a flowchart of still another specific implementation of a detection method in a high voltage detection circuit according to an embodiment of the present application.

For convenience of description, step S103 in the above embodiment may be specifically implemented as the above steps S1077 to S1078 to obtain FIG. 17. FIG. 17 is a flowchart of still another specific implementation of a detection method in a high voltage detection circuit according to an embodiment of the present application. The difference between FIG. 17 and FIG. 3 is that step S103 in the above embodiment may be specifically implemented as step S1077 to step S1078.

As for description about detection whether a target switch is in malfunction according to a detection signal acquired from the first adjustment unit and/or the second adjustment unit mentioned in the above steps S1077, S1078, S1081, and S1082, please refer to the description in the above embodiments in which whether a target switch is in malfunction is determined according to a detection signal acquired from the third detection unit and/or the fourth detection unit, and details are not described herein again.

For convenience of explanation, the resistor set in the above embodiment may include at least one resistor. If the resistor set includes more than two resistors, the resistors may be connected in series, in parallel or both in series and in parallel. The connection between the resistors and resistance values of the resistors are not limited herein.

Figure 18:
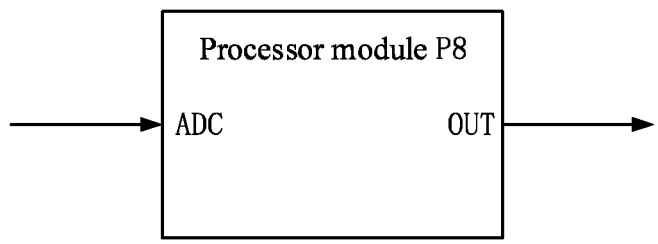
FIG. 18 is a schematic structural diagram of a processor module according to an embodiment of the present application.

FIG. 18 is a schematic structural diagram of a processor module according to an embodiment of the present application. The arrows on the left side and the right side of the processor module in FIG. 18 may indicate a flow direction of a signal or data, and may also indicate a connection with any other component in the high voltage detection circuit, and the connection of the processor module P8 with any other component in the high voltage detection circuit is not limited herein.

The processor module P8 has an input port and an output port. The processor module P8 may include an Analog to Digital Converter. The input port may specifically be an analog to digital converter interface. In FIG. 18, the input port is labeled as ADC, and the output port is labeled OUT. It should be noted that the number of input ports and output ports of the processor module P8 is not limited herein, and may be set according to specific operation situation and operation requirements.

It should be understood that the various embodiments in the description are described in a progressive manner, and the same or similar parts among the various embodiments may be referred to each other, and each embodiment focuses on differences from other embodiments. For embodiments of the detection method, relevant contents can be referred to the description for embodiments of the circuit. The present application is not limited to the specific steps and structures described above and illustrated in the drawings. It is possible for those skilled in the art to make various changes, modifications and additions, or change the order between the steps under the spirit of the present application. Also, a detailed description of known method techniques has been omitted herein for sake of brevity.

Those skilled in the art will appreciate that the above described embodiments are illustrative and not restrictive. Different technical features that appear in different embodiments may be combined to achieve a beneficial effect. Other variations of the disclosed embodiments can be understood and effected by those skilled in the art. In the claims, the term "comprising" does not exclude other components or steps; the indefinite article "a" or "an" does not exclude plural; and the term "first" and "second" or the like are used to name rather than limit in an any particular order. Any reference signs in the claims should not be construed as limiting the scope of the present application. Several functions in various parts in the claims may be implemented by a single hardware or software module. The appearance of certain technical features in different dependent claims does not mean that these technical features cannot be combined for certain benefits.

What is claimed is:

1. A high voltage detection circuit, comprising:
a first detection module, wherein a first port of the first detection module is connected to a terminal of the master positive switch where a master positive switch is connected to a battery pack of the high voltage circuit, a second port of the first detection module is connected to a terminal of a master negative switch where the master negative switch is connected to the battery pack, and a third port of the first detection module is connected to a reference voltage terminal; and
wherein the first detection module comprises a first detection unit and a second detection unit, and wherein one terminal of the first detection unit is the first port of the first detection module, the other terminal of the first detection unit is the third port of the first detection module, and one terminal of the second detection unit is connected to the third port of the first detection module, the other terminal of the second detection unit is the second port of the first detection module,
wherein the first detection unit comprises a series connection of first resistor sets and a first switch device, and the second detection unit comprises a series connection of second resistor sets and a second switch device, and wherein the first switch device of the first detection unit is connected between the master positive switch and the first resistor sets of the first detection unit, and the second switch device of the second detection unit is connected between the master negative switch and the second resistor sets of the second detection unit,
wherein the first resistor sets of the first detection unit are placed correspondingly to the second resistor sets of the second detection unit such that each of the first resistor sets of the first detection unit corresponds to one of the second resistor sets of the second detection unit, and have the same resistance value as respective resistor sets of the second detection unit, and
a processor module, wherein the processor module is connected to the first detection module and the second detection module, wherein the high voltage detection circuit comprises:
a current adjustment module, wherein a first port of the current adjustment module is connected to a terminal of the master positive switch in the high voltage circuit where the master positive switch is connected to a load, a second port of the current adjustment module is connected to a terminal of the master negative switch in the high voltage circuit where the master negative switch is connected to the load, and a third port of the current adjustment module is connected to the reference voltage terminal,
wherein the current adjustment module comprises a first adjustment unit and a second adjustment unit; and
wherein one terminal of the first adjustment unit is the first port of the current adjustment module, and the other terminal of the first adjustment unit is the third port of the current adjustment module, wherein the first adjustment unit comprises a series connection of a third resistor set and a third switch device; and one terminal of the second adjustment unit is the third port of the current adjustment module, the other terminal of the second adjustment unit is the second port of the current adjustment module, wherein the second adjustment unit comprises a series connection of a fourth resistor set and a fourth switch device,
wherein the third switch device of the first adjustment unit is connected between the master positive switch and the third resistor set of the first adjustment unit, and the fourth switch device of the second adjustment unit is connected between the master negative switch and the fourth resistor set of the second adjustment unit;
during power-off of the high voltage circuit, the first current adjustment unit and the second current adjustment unit are turned on, wherein a desired operation state of the master positive switch is an off state and a desired operation state of the master negative switch is an on state,
wherein the processor module is configured to determine the master positive switch is in malfunction when a first detection signal is equal to a second detection signal, wherein the first detection signal is a voltage signal between at least one of the first resistor sets of the first detection unit and the reference voltage terminal, and the second detection signal is a voltage signal between at least one of the resistor sets of the second detection unit and the reference voltage terminal.

2. The high voltage detection circuit of claim 1, wherein the resistor sets in the first adjustment unit and the resistor sets in the second adjustment unit are set as one of the followings:
a total resistance value of all of resistor sets in the first adjustment unit is equal to a total resistance value of all of resistor sets in the second adjustment unit, and the total resistance value of all of resistor sets in the first adjustment unit is smaller than a total resistance value of all of resistor sets in a first detection unit.

3. The high voltage detection circuit of claim 1, wherein the processor module is further configured to acquire a detection signal from the first adjustment unit, and determine that the master positive switch is in malfunction when the detection signal remains unchanged,
wherein the detection signal acquired by the processor module from the first adjustment unit is a voltage signal between at least one resistor set of the first adjustment unit and the reference voltage terminal.

4. The high voltage detection circuit of claim 1, wherein the first adjustment unit is in parallel connection with an insulating impedance from the master positive switch to the reference voltage terminal, and the second adjustment unit is in parallel connection with an insulating impedance from the master negative switch to the reference voltage terminal.

5. A high voltage detection circuit, comprising:
a first detection module, wherein a first port of the first detection module is connected to a terminal of the master positive switch where a master positive switch is connected to a battery pack of the high voltage circuit, a second port of the first detection module is connected to a terminal of a master negative switch where the master negative switch is connected to the battery pack, and a third port of the first detection module is connected to a reference voltage terminal; and
wherein the first detection module comprises a first detection unit and a second detection unit, and wherein one terminal of the first detection unit is the first port of the first detection module, the other terminal of the first detection unit is the third port of the first detection module, and one terminal of the second detection unit is connected to the third port of the first detection module, the other terminal of the second detection unit is the second port of the first detection module,
wherein the first detection unit comprises a series connection of first resistor sets and a first switch device, and the second detection unit comprises a series connection of second resistor sets and a second switch device, and wherein the first switch device of the first detection unit is connected between the master positive switch and the first resistor sets of the first detection unit, and the second switch device of the second detection unit is connected between the master negative switch and the second resistor sets of the second detection unit,
a processor module, wherein the processor module is connected to the first detection module,
wherein the high voltage detection circuit comprises:
a current adjustment module, wherein a first port of the current adjustment module is connected to a terminal of the master positive switch in the high voltage circuit where the master positive switch is connected to a load, a second port of the current adjustment module is connected to a terminal of the master negative switch in the high voltage circuit where the master negative switch is connected to the load, and a third port of the current adjustment module is connected to the reference voltage terminal,
wherein the current adjustment module comprises a first adjustment unit and a second adjustment unit; and
wherein one terminal of the first adjustment unit is the first port of the current adjustment module, and the other terminal of the first adjustment unit is the third port of the current adjustment module, wherein the first adjustment unit comprises a series connection of a third resistor set and a third switch device; and one terminal of the second adjustment unit is the third port of the current adjustment module, the other terminal of the second adjustment unit is the second port of the current adjustment module, wherein the second adjustment unit comprises a series connection of a fourth resistor set and a fourth switch device,
wherein the third switch device of the first adjustment unit is connected between the master positive switch and the third resistor set of the first adjustment unit, and the fourth switch device of the second adjustment unit is connected between the master negative switch and the fourth resistor set of the second adjustment unit;

during power-off of the high voltage circuit, the master positive switch is being switched from an on state to an off state, and the first current adjustment unit and the second current adjustment unit are turned on, wherein a desired operation state of the master positive switch is an off state, wherein the processor module is configured to determine the master positive switch is in malfunction when a first detection signal is kept unchanged, wherein the first detection signal is a voltage signal between at least one of the first resistor sets of the first detection unit and the reference voltage terminal.

6. A high voltage detection circuit, comprising:

a first detection module, wherein a first port of the first detection module is connected to a terminal of the master positive switch where a master positive switch is connected to a battery pack of the high voltage circuit, a second port of the first detection module is connected to a terminal of a master negative switch where the master negative switch is connected to the battery pack, and a third port of the first detection module is connected to a reference voltage terminal; and wherein the first detection module comprises a first detection unit and a second detection unit, and wherein one terminal of the first detection unit is the first port of the first detection module, the other terminal of the first detection unit is the third port of the first detection module, and one terminal of the second detection unit is connected to the third port of the first detection module, the other terminal of the second detection unit is the second port of the first detection module, wherein the first detection unit comprises a series connection of first resistor sets and a first switch device, and the second detection unit comprises a series connection of second resistor sets and a second switch device, and wherein the first switch device of the first detection unit is connected between the master positive switch and the first resistor sets of the first detection unit, and the second switch device of the second detection unit is connected between the master negative switch and the second resistor sets of the second detection unit, a processor module, wherein the processor module is connected to the first detection module, wherein the high voltage detection circuit comprises:

a current adjustment module, wherein a first port of the current adjustment module is connected to a terminal of the master positive switch in the high voltage circuit where the master positive switch is connected to a load, a second port of the current adjustment module is connected to a terminal of the master negative switch in the high voltage circuit where the master negative switch is connected to the load, and a third port of the current adjustment module is connected to the reference voltage terminal, wherein the current adjustment module comprises a first adjustment unit and a second adjustment unit; and wherein one terminal of the first adjustment unit is the first port of the current adjustment module, and the other terminal of the first adjustment unit is the third port of the current adjustment module, wherein the first adjustment unit comprises a series connection of a third resistor set and a third switch device; and one terminal of the second adjustment unit is the third port of the current adjustment module, the other terminal of the second adjustment unit is the second port of the current adjustment module, wherein the second adjustment unit comprises a series connection of a fourth resistor set and a fourth switch device, wherein the third switch device of the first adjustment unit is connected between the master positive switch and the third resistor set of the first adjustment unit, and the fourth switch device of the second adjustment unit is connected between the master negative switch and the fourth resistor set of the second adjustment unit;

a detection signal adjustment module, wherein one terminal of the detection signal adjustment module is connected to the first port of the first detection module, and the other terminal of the detection signal adjustment module is connected to the third port of the first detection module, and wherein the detection single adjustment module comprises a series connection of a resistor set and a switch device, and wherein the switch device is controlled to be turned on at an internal to adjust the first detection signal, during power-off of the high voltage circuit, the first current adjustment unit and the second current adjustment unit are turned on, wherein a desired operation state of the master positive switch is an off state and a desired operation state of the master negative switch is an on state, wherein the processor module is configured to determine the master positive switch is in malfunction when a slope of a change in waveform of the first detection signal has an absolute value smaller than a preset slope threshold.

* * * * *